United States Patent [19]
Abbe et al.

[11] Patent Number: 5,511,005
[45] Date of Patent: Apr. 23, 1996

[54] WAFER HANDLING AND PROCESSING SYSTEM

[75] Inventors: Robert C. Abbe, Newton; Noel S. Poduje, Needham Heights; Randal K. Goodall, North Chelmsford, all of Mass.; Peter Domenicali, Montpelier, Vt.

[73] Assignee: ADE Corporation, Newton, Mass.

[21] Appl. No.: 197,394

[22] Filed: Feb. 16, 1994

[51] Int. Cl.⁶ .......................... G01R 31/265; G06F 17/60
[52] U.S. Cl. .......................... 364/552; 324/719; 324/765; 364/478
[58] Field of Search .................................. 324/719, 765; 364/478, 552, 578

[56] References Cited

U.S. PATENT DOCUMENTS

| | | | |
|---|---|---|---|
| 2,767,914 | 10/1956 | Merrill et al. | 364/552 |
| 3,039,056 | 6/1962 | Many et al. | 324/765 |
| 3,039,604 | 6/1962 | Bicket et al. | 324/765 X |
| 3,775,679 | 11/1973 | Abbe | 324/61 R |
| 3,986,109 | 10/1976 | Poduje | 324/61 R |
| 3,990,005 | 11/1976 | Abbe et al. | 324/61 R |
| 4,103,232 | 7/1978 | Sugita et al. | 324/754 |
| 4,217,542 | 8/1980 | Abbe et al. | 324/57 R |
| 4,219,110 | 8/1980 | Ubukata | 198/380 |
| 4,311,427 | 1/1982 | Coad et al. | 414/217 |
| 4,556,317 | 12/1985 | Sandland et al. | 356/237 |
| 4,618,938 | 10/1986 | Sandland et al. | 364/552 |
| 4,644,172 | 2/1987 | Sandland et al. | 250/548 |
| 4,750,141 | 6/1988 | Judell et al. | 364/550 |
| 4,755,746 | 7/1988 | Mallory et al. | 324/719 X |
| 4,789,294 | 12/1988 | Sato et al. | 414/416 |
| 4,836,733 | 6/1989 | Hertel et al. | 414/225 |
| 4,849,916 | 7/1989 | Abbe et al. | 364/563 |
| 4,860,229 | 8/1989 | Abbe et al. | 364/563 |
| 4,881,863 | 11/1989 | Braginsky | 414/225 |
| 4,904,153 | 2/1990 | Iwasawa et al. | 414/735 |
| 4,911,597 | 3/1990 | Maydan et al. | 414/217 |
| 4,931,962 | 6/1990 | Palleiko | 364/550 |
| 5,100,276 | 3/1992 | Iwasaki et al. | 414/222 |
| 5,164,905 | 11/1992 | Iwasaki et al. | 364/478 X |
| 5,270,222 | 12/1993 | Moslehi | 437/8 |

*Primary Examiner*—Edward R. Cosimano
*Attorney, Agent, or Firm*—Weingarten, Schurgin, Gagnebin & Hayes

[57] ABSTRACT

A system for semiconductor wafer processing including wafer measurement and characterization having vertical wafer processing apparatus with which only the edge of a wafer is contacted. A wafer processing station is provided having a support bridge to which a rotor subassembly is attached. The rotor subassembly includes a housing and a rotor having a central aperture and a retention mechanism for retaining a wafer in a measurement position. A pair of pivotable probe arms includes one probe arm positioned on either side of the wafer. A sensor provides an image of a wafer prior to its retention by the retention mechanism in the measurement position in order to permit the retention mechanism to avoid any flat on the wafer. Additional sensors eliminate the effect of wobble or vibration of the rotor on wafer measurement results. Artifact removal processors are provided for removing errors in the measured wafer data and a database stores the uncorrupted and corrected data. The system couples with a data network to allow global viewing of wafer processing trouble spots. A correlation of information from actual data and wafer processing simulation is provided for allowing the application of corrective measures before processes deviate beyond control or specification limits.

31 Claims, 15 Drawing Sheets

$$t = D - (w_1 + w_2) - (d_1 + d_2 + d_3 + d_4)$$

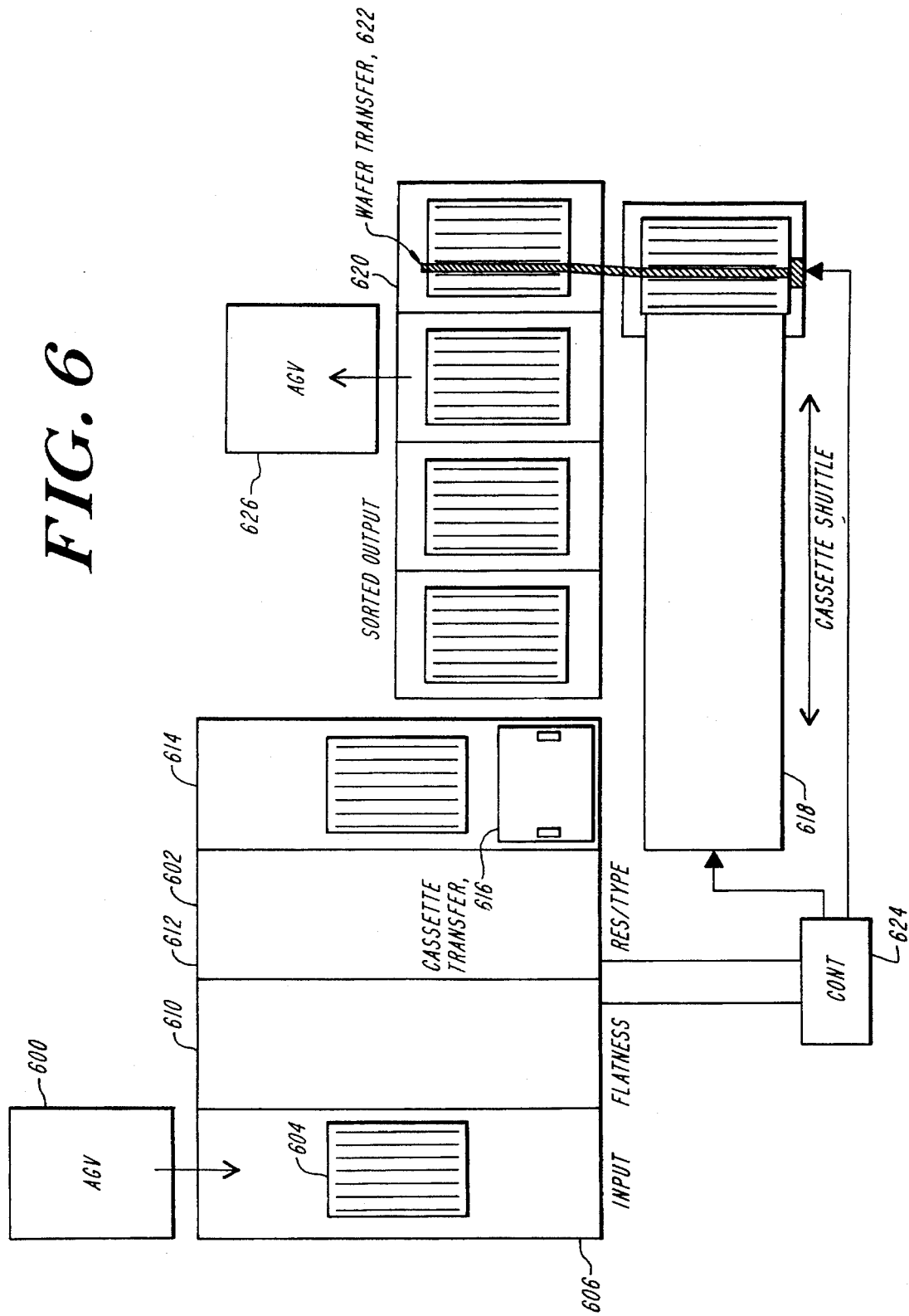

5,511,005

WAFER HANDLING AND PROCESSING SYSTEM

FIELD OF THE INVENTION

This invention relates generally to wafer handling and measurement apparatus and more particularly to an improved wafer handling, processing, and measurement system.

BACKGROUND OF THE INVENTION

Apparatus for handling and measuring semiconductor wafers is known. Typical facilities which utilize such apparatus include wafer fabrication facilities as well as semiconductor integrated circuit manufacturers. Such apparatus generally includes one or more measurement stations for receiving wafers and measuring different wafer parameters and carrier containers for storing the wafers during transport between measurement stations as well as between measurement stations and packaging and shipping stations by facility personnel. Excessive human handling and transport of the wafers during processing can be disadvantageous due to the increased opportunity for contamination and inadvertent destruction of the wafers.

Typical wafer handling apparatus includes a mount of some sort for receiving a wafer for measurement, such as a vacuum chuck. Such a mount contacts a relatively large surface area of the wafer resulting in potential contamination and a reduction in the wafer surface area accessible for measurement. In order to provide useful output data of the measurement stations, it is generally necessary to align any flat or fiducial on the wafer in a predetermined orientation so that the output data can be correlated to coordinates of the wafer.

SUMMARY OF THE INVENTION

In accordance with the invention, vertical wafer processing apparatus is provided in which only the edge of a wafer is contacted. Vertical wafer handling is desirable since particulate contamination is reduced due, in part, to the vertical laminar airflow across the wafers. Distortion of the semiconductor wafers, which may result from the effects of gravity associated with horizontal wafer handling, is also reduced. Limiting contact to the wafer edge is advantageous since it reduces the potential detrimental effect of wafer contact, such as increased contamination and destruction. Moreover, wafer edge handling permits measurement coverage of both full surfaces of the wafer.

The wafer processing apparatus includes a wafer processing, or measurement station which, in one embodiment, has a support bridge to which a rotor subassembly is attached. The rotor subassembly includes a housing and a rotor having a central aperture and a retention mechanism, such as a plurality of movable grippers, for retaining a wafer in a measurement position. The rotor central aperture permits access to both sides of a received wafer for measurement. In one embodiment, a pair of pivotable probe arms is provided with one probe arm positioned on either side of the wafer. Each of the probe arms has a pair of wafer measuring probes mounted thereto on a side adjacent to the wafer and a pair of reference probes mounted on a side opposite to the wafer measuring probes.

Various types of probes and wafer sensor arrangements, such as probes with capacitive sensors, as well as other types of wafer sensing mechanisms, such as optical devices, are suitable for use with the described apparatus. Such wafer sensing mechanisms may be supported by rotatable arms, such as the above mentioned probe arms, or may be supported in other manners in the station. Moreover, the station may be utilized for carrying out various wafer processing steps, such as laser marking, contamination removal, or material removal. The versatility of the described apparatus permits various wafer scan patterns to be achieved.

The station includes a pair of reference bars disposed adjacent to the front and rear probe arms, respectively. Each of the reference probes provides a signal indicative of the distance to the adjacent reference bar. A signal processor receives the reference probe distance signals as well as signals from the wafer measurement probes indicative of the distance to the adjacent wafer side and, with knowledge of the predetermined distance between the reference bars, computes the wafer thickness. Various other types of wafer measurements may also be made.

A transfer mechanism is provided for transferring a wafer vertically to the measurement position of the station. In one embodiment, the transfer mechanism includes an extractor for engaging the bottom edge of the wafer and a guide for engaging the top edge of the wafer. With this arrangement, a wafer is firmly and securely supported for vertical transfer, such as from a cassette disposed below the station upward to the measurement position, with only the wafer edge being contacted.

In accordance with a feature of the invention, a sensor is provided to scan a wafer prior to its retention by the rotor grippers. With the sensor measured data, the location of any flat(s) or fiducial(s) on the wafer can be ascertained and the rotor rotated accordingly prior to retention of the wafer to ensure that the grippers avoid any such flat(s) or fiducial(s).

Additional sensors are provided for eliminating the effect of wobble or vibration of the rotor on wafer measurement results. More particularly, three such sensors measure the distance from a stationary reference, such as the rotor subassembly housing, to the rotor itself in order to determine the plane of the rotor. With this information, the deviation of the rotor plane from a fixed reference plane can be ascertained and used to correct probe measured data accordingly.

Apparatus for both batch wafer processing as well as single wafer conveyance and measurement is described. Both such processing systems include a plurality of stations, each one having one or more measurement sensors or processing apparatus associated therewith. Each of the measurement sensors provides output data indicative of a characteristic, or parameter of a measured wafer. Artifact removal processors are provided for removing errors in the measured wafer data and a database stores the uncorrupted and fully corrected wafer data. This arrangement provides a database of particular value as a permanent record since it represents characteristics of actual wafers in a virtual, or data domain.

A computer controller activates one or more of a plurality of information extractors which access wafer data measured by one or more of the measurement sensors and contained in the database. This arrangement is advantageous since the output data from different types of sensors can be combined in accordance with extractor rules to enhance the quality of determinable wafer information.

Plural virtual databases are coupled together via information hubs, or links which coordinate sources and users of wafer information. Moreover, plural information hubs are interconnected via an information network. The databases thus linked may be distributed throughout an entire factory or facility, such as a wafer fabrication facility or a semiconductor device manufacturing facility, and in fact, may be distributed throughout more than one such facility. Terminals and wafer data sources coupled to the information network may be built on different platforms and operating systems.

Providing an entire semiconductor processing system with the ability to rapidly and transparently access relevant data available in multiple virtual databases through a network enables an operator at a user terminal to view and diagnose plant processing deviations based on a distributed measurement system in order to provide early corrective action. To this end, a display is described for accessing wafer information according to desired search parameters corresponding to a data correlating and decorrelating scheme. The display includes icons which indicate the degree of normalcy of a desired wafer search parameter by color variations or other coding of the icons. One display scheme presents different icons for different days of wafer processing. An additional display level can be driven by selecting one such daily icon, such as one which indicates a departure from normalcy. Selection of the icon expands the particular processing day to show a further plurality of icons representing wafer parameters measured on that particular day, again each icon being coded to indicate a deviation of the measured parameter from some specified value or range. The display can be further expanded to provide icons representing individual wafers and other useful search criteria without the need to understand operating systems, file management systems or database programming languages.

In accordance with a further aspect of the invention, a semiconductor wafer processing control system includes a real time wafer processing computer simulation operating simultaneously with an actual wafer processing sequence. Processors are provided to compare actual wafer output data from wafer measurement apparatus with simulated data and to provide a difference in accordance with the comparison. A processor is provided to identify corrective actions for the actual wafer processing sequence in response to the difference signal. Such corrective actions may be implemented in the actual wafer processing sequence either ahead or behind or at the same level of processing as the stage at which the actual wafer data are measured. With this arrangement, early real time detection and correction of wafer processing problems is provided supporting increased yield and process equipment utilization.

BRIEF DESCRIPTION OF THE DRAWINGS

The foregoing features of this invention, as well as the invention itself, may be more fully understood from the following detailed description of the invention in which:

FIG. 6 is a schematic representation of a multi-measurement station type processing for plural wafers and plural cassettes;

DESCRIPTION OF THE PREFERRED EMBODIMENT

Figure 1:
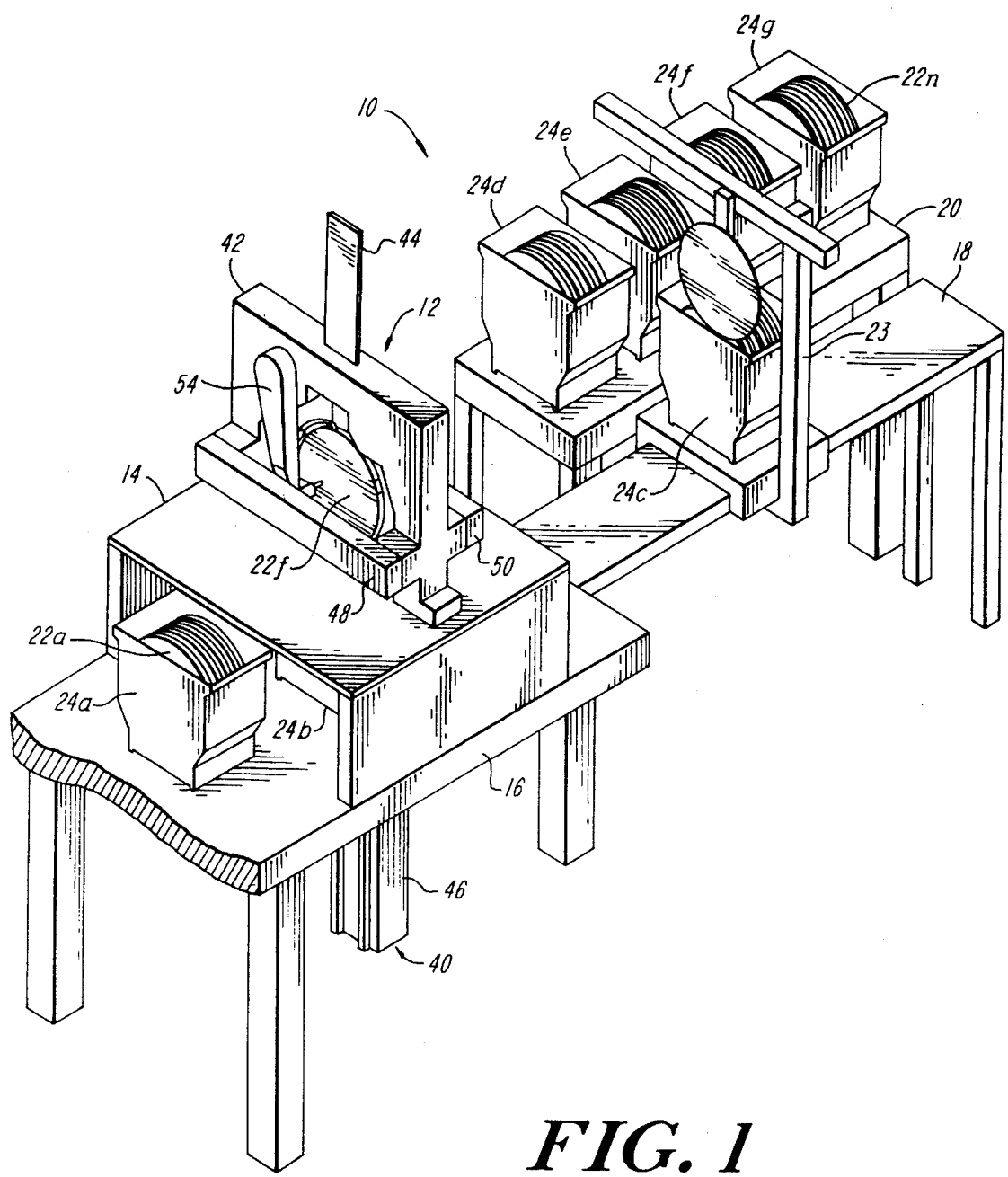
FIG. 1 is an isometric view of wafer handling and measurement apparatus in accordance with the present invention.

Referring to FIG. 1, wafer handling and measurement apparatus 10 is shown to include a wafer processing station such as a measurement station 12 for receiving and measuring characteristics of substantially circular wafers or disks, such as semiconductor wafers. While the apparatus 10 is discussed herein in conjunction with the handling and measurement of semiconductor wafers, the apparatus is equally suitable for measuring characteristics of other substantially circular articles, such as rotating magnetic memory disks. The wafers 22a–22n are stored in transport cassettes 24c during transport to and from the wafer measurement station 12 and are subsequently stored in cassettes 24d–24g. Each of the cassettes 24a–24g has a plurality of grooves shaped and sized to receive one of the wafers and to maintain the received wafers in a substantially vertical orientation. Such cassettes 24a–24g have an open bottom in order to facilitate vertical transfer of the wafers into a retention, or measurement position within the station 12, as will be described.

The measurement station 12 is supported by a base plate 14 which, in turn, is supported by a measurement table 16. The measurement table 16 may include a conveyor belt for moving the cassettes 24a–24c along the table 16 to an adjacent transfer table 18. The movement of the cassettes 24a–24c along the measurement table 16 is intermittent in that, once a cassette 24b, for example, is in substantial vertical alignment with the measurement station 12, the cassette 24b remains stationary while a semiconductor wafer contained therein is vertically transferred to the measurement position within the station 12, processed such as by making measurements, and returned to the cassette 24b. More specifically, the cassette 24b is incrementally moved, or stepped along the table 16 to bring each wafer contained therein into precise vertical alignment with a slot 60 (FIG. 3) in the base plate 14, as will be discussed.

From the transfer table 18, wafer moving apparatus 23 selectively picks up the measured wafers and places the wafers into one of a plurality of storage cassettes 24d–24g located on an adjacent storage table 20 in accordance with various measured wafer characteristics. That is, it is often desirable to sort wafers so that ones with like characteristics are stored in the same storage cassette 24d–24g for further processing or shipment. It will be appreciated that the number and arrangement of transfer tables 18, storage tables 20, transport and storage cassettes 24a–24g and the like will vary in accordance with a particular measuring and handling application and the facility in which such operations are to be carried out.

A transfer mechanism 40 is provided to vertically transfer wafers 22a–22n, one at a time, from the cassettes 24a–24c to the measurement station 12. More particularly, the transfer mechanism 40 transfers a wafer 22f, for example, positioned in precise vertical alignment with the slot 60 in the base plate 14 (FIG. 3) from the cassette 24b to the measurement position, as will be described. Suffice it here to say that during wafer transfer from a cassette to the measurement position, the wafers are maintained substantially vertical. Since the wafers 22a–22n are also held substantially vertical during transport along and between the tables 16, 18, 20 by the cassettes 24a–24g, the wafers 22a–22n are maintained substantially vertical during the entire handling and measurement process. Vertical orientation of the wafers 22a–22n is advantageous since particulate contamination is reduced due, in part, to the vertical laminar air flow over the wafers. Moreover, distortion of the semiconductor wafers, which may result from the effects of gravity associated with horizontal wafer handling, is reduced.

Figure 2:
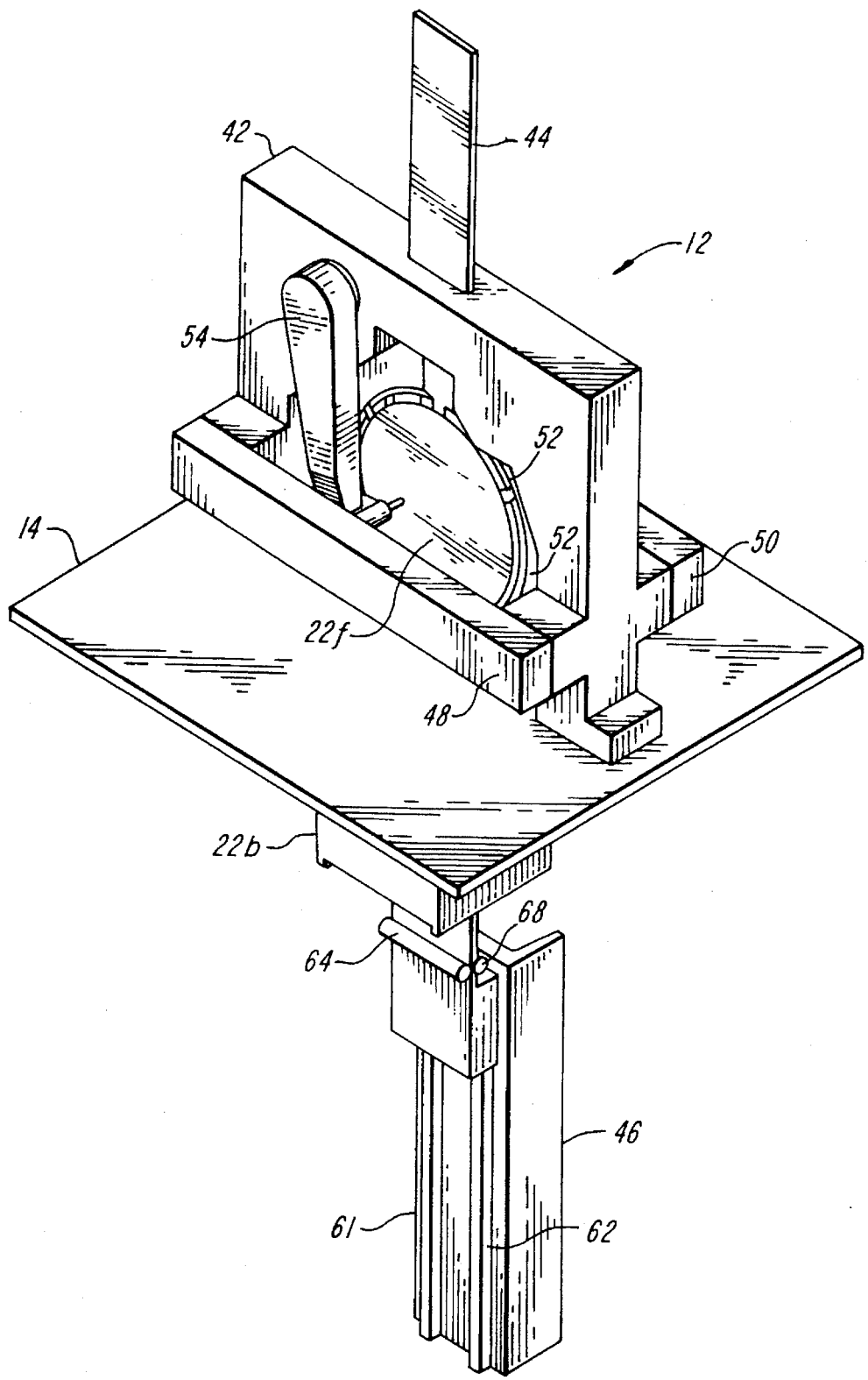
FIG. 2 is an isometric view of the processing station of the wafer handling and processing apparatus of FIG. 1.

Referring also to FIG. 2, the measurement station 12 is shown to include a support bridge 42 from which a top wafer support 44 and a bottom wafer transfer support beam 46 extend. Although not shown in the simplified view of FIG. 2, the bottom wafer transfer support beam 46 is rigidly coupled to the measurement table 16. The measurement position in which the wafers, such as exemplary wafer 22f, are retained during measurement is defined by a rotor subassembly 52 (see also FIGS. 4 and 5) and specifically, by a central aperture 88 in the rotor 86.

A front reference bar 48 extends along a front surface of the support bridge 42 and similarly, a rear reference bar 50 extends along a rear surface of the support bridge 42. Front and rear probe arms 54, 56 (see also FIG. 3) are disposed between the front and rear reference bars 48, 50 and the support bridge 42, respectively, and support probes having sensors that are operable to measure various characteristics of a wafer located in the measurement position, as will be described. The front and rear reference bars 48, 50 provide a fixed reference for accurately aligning the probe arms 54, 56 in the manner described below in conjunction with FIG. 3B. Suffice it here to say that with this arrangement, probe position information is ascertainable at all times relative to the fixed reference surfaces 48, 50.

Figure 3:
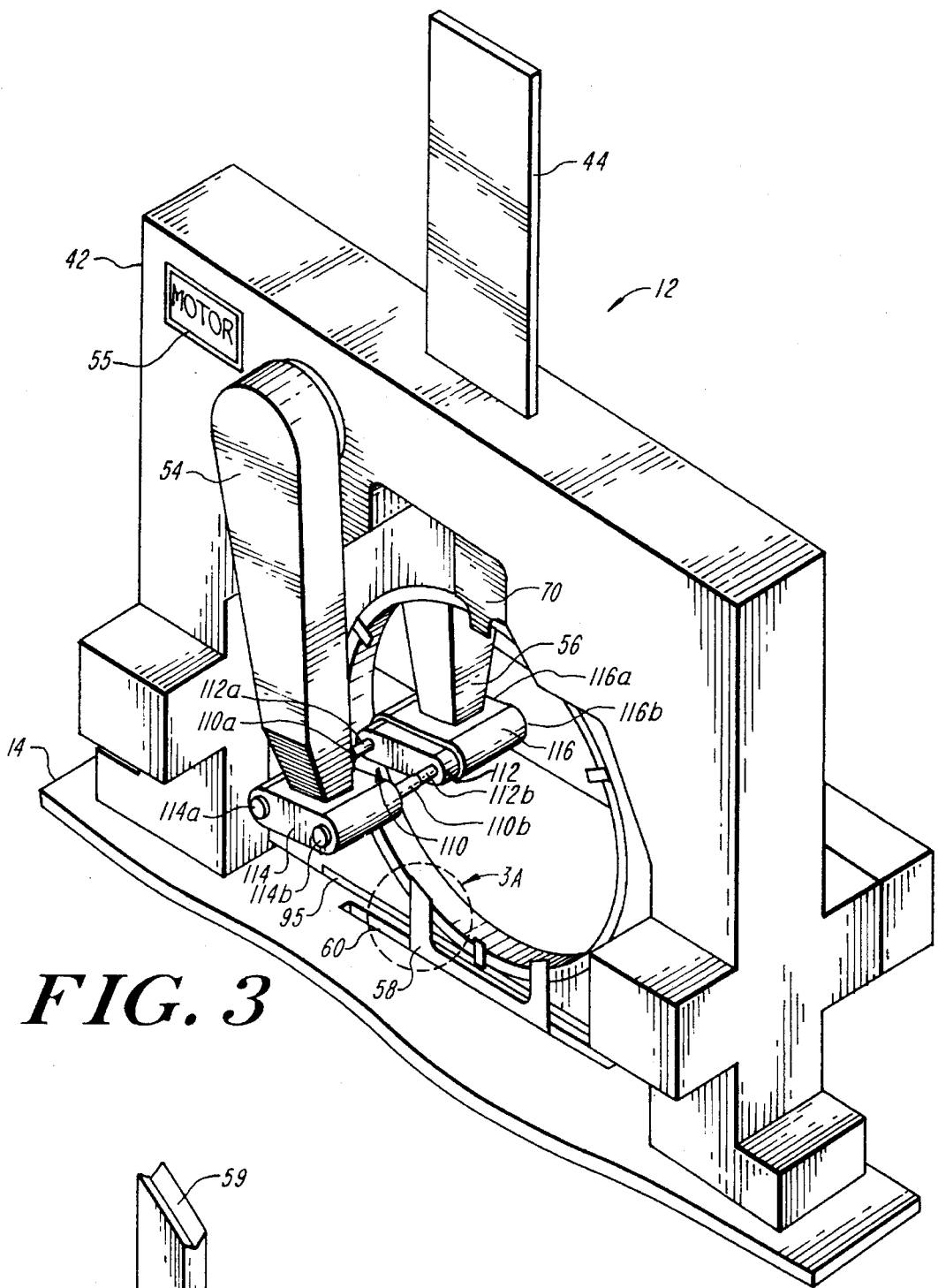
FIG. 3 is an expanded view of the processing station of FIG. 2.

Referring also to the expanded view of the processing station 12 in FIG. 3, the wafer transfer mechanism 40 includes an extractor 58 coupled to the bottom wafer transfer support beam 46 and a wafer guide 70 coupled to the lower end of the top wafer support 44 for vertically transferring a wafer from a cassette to the measurement station 12. With the extractor 58, the wafer guide 70 supports a wafer during vertical transfer. The wafer transfer mechanism 40 includes extractor guide means for guiding the extractor 58 as it is moved vertically, such as a pair of slide rails 61, 62 and support means 64, 68 as shown in the illustrative embodiment of FIG. 2.

As noted, the base plate 14 has a slot 60 through which a wafer is moved by the transfer mechanism 40. That is, a wafer, such as exemplary wafer 22f, is in position for transfer to the measurement position when the cassette, such as exemplary cassette 24b, in which the wafer 22f is disposed is in substantial vertical alignment below the measurement station 12, with the wafer 22f in precise alignment with the slot 60. Upon activation of the wafer extractor 58, the lower edge of the wafer 22f is engaged by the extractor 58 and pushed upward from the cassette 24b, through the slot 60, and to the measurement position of the station 12, as shown in FIG. 2. More particularly, as the wafer 22f is being pushed upward by the extractor 58, the wafer guide 70, which has been lowered to engage the upper edge of the wafer 22f, guides the wafer 22f as it is moved upward. With both the extractor 58 and the guide 70 contacting the wafer, the wafer 22f is securely supported for vertical movement.

Figure 3A:
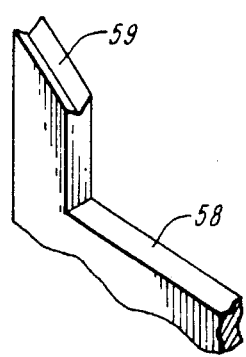
FIG. 3A is an expanded view of the extractor of FIG. 3.

Referring to FIG. 3A, an expanded view of a portion of the extractor 58 illustrates that the extractor 58 includes a V-shaped edge contacting portion 59 for engaging, or contacting only the outer edge of the wafer 22f. Generally, semiconductor wafers 22a–22n have a rounded edge around the circumference. The extractor portion 59 contacts only this outer rounded wafer edge. Likewise, the substantially identical wafer guide 70 only contacts the outer rounded wafer edge.

Figure 4A:
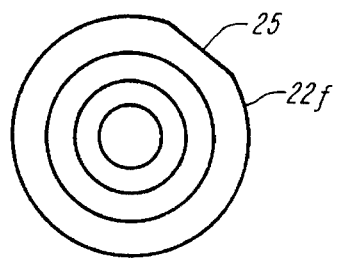
FIG. 4A is an exemplary wafer scanning pattern achievable with the apparatus of the present invention.
Figure 4B:
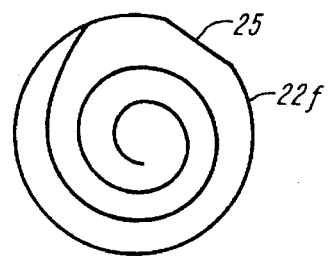
FIG. 4B is an alternative wafer scanning pattern achievable with the apparatus of the present invention.
Figure 4C:
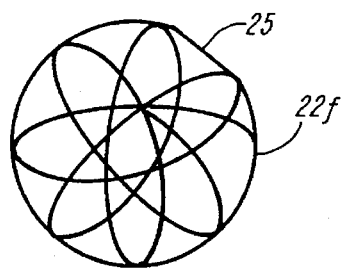
FIG. 4C is a further alternative wafer scanning pattern achievable with the apparatus of the present invention.
Figure 4D:
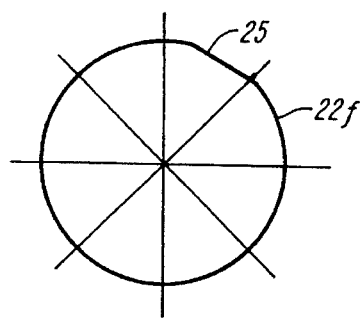
FIG. 4D is all other wafer scanning pattern achievable with the apparatus of the present invention.
Figure 4:
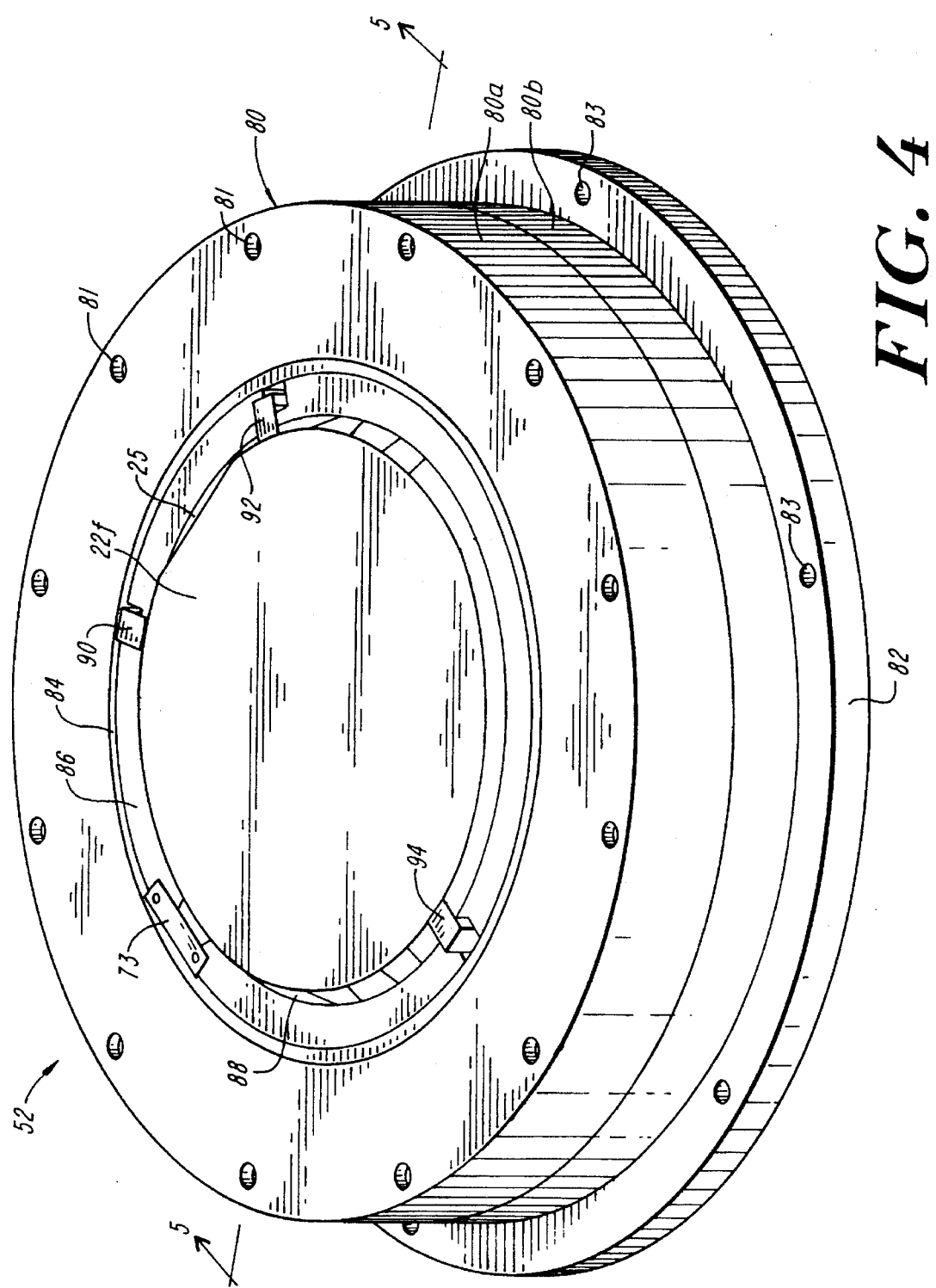
FIG. 4 is a perspective view of the rotor subassembly of the processing station of FIG. 2.

Referring also to FIG. 4, the rotor subassembly 52 is shown to include a circular housing 80 having a concentric mounting flange 82 of a slightly larger diameter than the housing 80. The mounting flange 82 has a plurality of apertures 83 for receiving fasteners, such as screws, for securing the rotor subassembly 52 to a mounting surface in the support bridge 42 of the measurement station 12. The housing 80 has a central aperture 84 in which a rotor 86 is rotatably positioned.

The rotor 86 has a central aperture 88 shaped and sized to receive a semiconductor wafer 22a–22n, such as exemplary wafer 22f having a flat 25 (FIG. 4). Rotor 86 also includes a plurality of grippers 90, 92, 94 for holding the received wafer 22a–22n in place relative to the rotor 86. Rotation of the rotor 86 provides concomitant rotation of the retained wafer 22f. The rotor 86 is rotated prior to loading a wafer into the rotor 86 as will be discussed and is also rotated during measurements.

The housing 80 is shown as comprising two separable pieces 80a, b (FIG. 5) in order to facilitate manufacture. To this end, the upper and lower housing portions 80a, 80b have a plurality of apertures 81 for receiving fasteners in order to assemble the housing 80. Also provided on the housing 80 is a gage block 73 used to calibrate the measurement probes, as will be discussed.

The rotor 86 and housing 80 may be comprised of any material suitable in view of cost and manufacturing considerations, such as hard-coated aluminum, which advantageously reduces contamination. The grippers 90–94 may be comprised of any suitable material and are preferably comprised of silicon carbide which minimizes contamination of a retained wafer.

Figure 5:
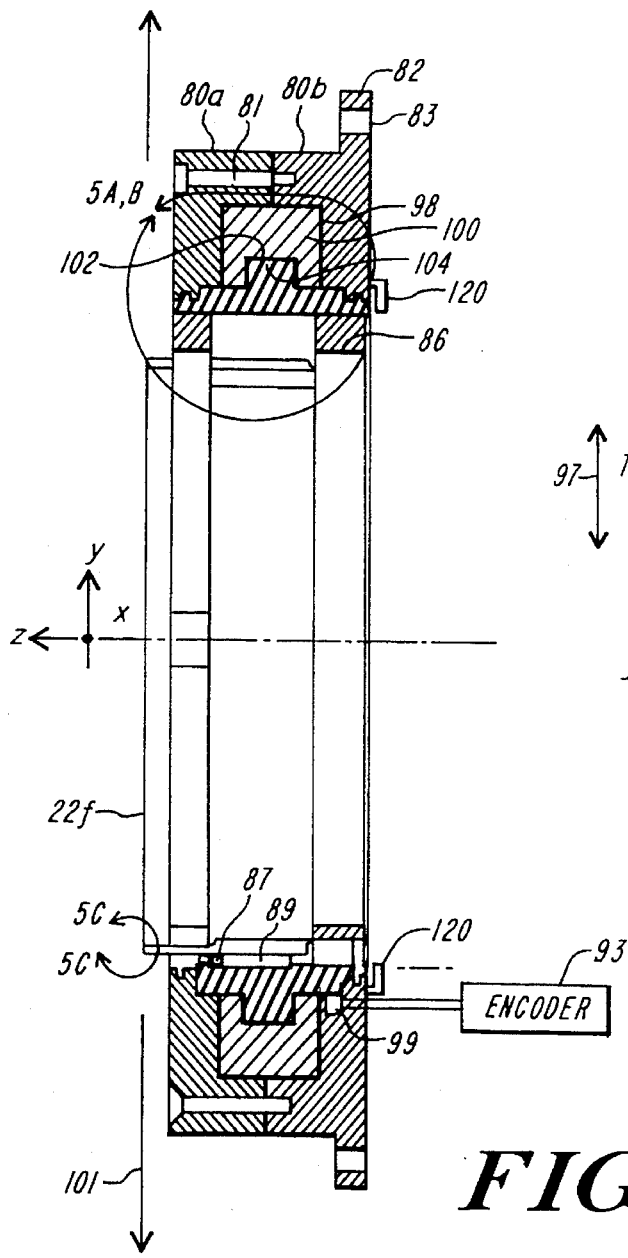
FIG. 5 is a cross-sectional view of the rotor subassembly taken along line 5—5 of FIG. 4.

Referring also to the cross-sectional view of the rotor subassembly 52 in FIG. 5, the rotor 86 is rotated by a DC motor including a stator coil assembly 100 and a magnetic ring 104. Sidewalls of the housing aperture 84 have a channel 98 in which the stator coil assembly 100 is disposed. The stator coil assembly 100 has a groove 102, as shown. The magnetic ring 104 is disposed on the outer surface of the rotor sidewalls and has a complementary shape to the stator coil groove 102 so that the magnetic ring 104 fits inside of the stator coil groove 102 for rotatable actuation thereby. The magnetic ring 104 has a plurality of poles associated therewith and may be comprised of any suitable material, including ceramic. An optical encoder 93 is provided to control the motor speed and includes a light source and detector unit 99 coupled to the stationary housing 80. Quadrature detection of the light reflected by a scale, or index located on the adjacent movable rotor 86 permits detection of the direction of rotor movement.

Figure 5C:
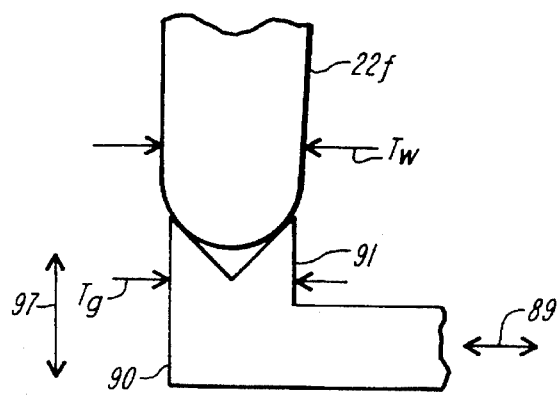
FIG. 5C is an expanded view of a gripper of the rotor subassembly of FIG. 5 shown engaging an exemplary wafer.
Figure 5A:
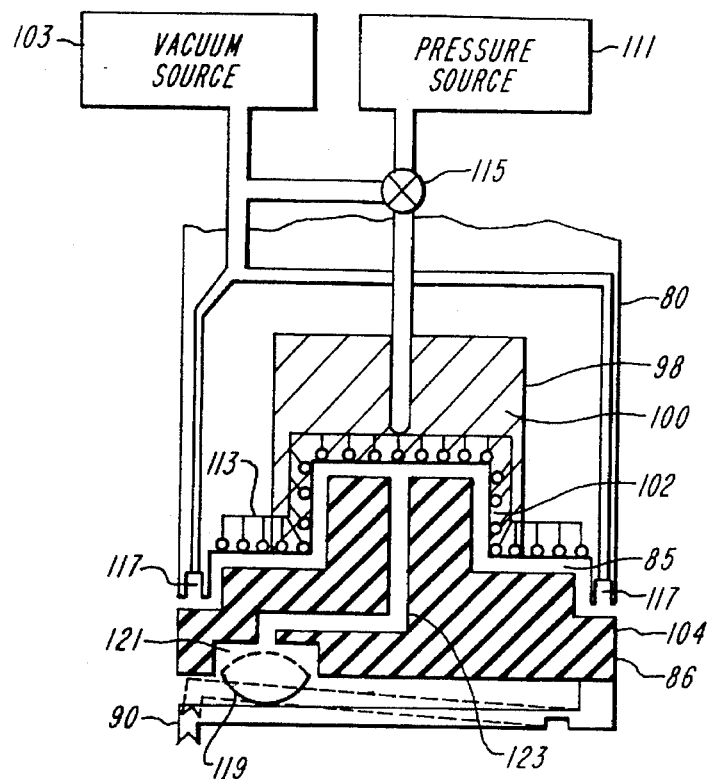
FIG. 5A is an expanded view of the air bearing and a gripper of the rotor subassembly of FIG. 5.

Referring also to the enlarged view of a portion of the rotor subassembly in FIG. 5A, an air bearing 85 is provided between the rotor 86 and the housing 80 in order facilitate low friction rotation of the rotor 86. To this end, a pressure source 111 is coupled to a manifold arrangement 113 which in turn is coupled to a plurality of apertures in communication with the air bearing 85, as shown. A valve 115 is provided in the coupling between the manifold 113 and the pressure source 111 in order to permit the air bearing 85 to be pressurized, de-pressurized, or coupled to a vacuum source 103, as will be described. Preferably, the pressure and vacuum sources 111, 103, respectively, as well as the valve 115 are remotely located with respect to the rotor subassembly 52 and the valve 115 is electronically controllable.

In operation, when the rotor 86 is rotated, the valve 115 is positioned to couple the pressure source 111 to the manifold 113 in order to pressurize the bearing 85. The vacuum mechanism 103 is coupled to a pair of apertures, or inlets 117 in communication with the air bearing 85 as shown to draw air from the bearing during rotation of the rotor. This arrangement prevents air in the bearing from exiting the bearing and thus serves to scavenge or remove any particulate contamination in the air bearing 85 between the housing 80 and the rotor 86. In this way, any particulates that might otherwise contaminate a retained wafer are removed.

In one embodiment, each of the three grippers 90–94 of the rotor 86 is moveable in order to facilitate loading and unloading of a semiconductor wafer in the measurement position. The grippers 90–94 may be moved by any suitable actuator, such as with a spring 87 activated by creating a vacuum in voids 89 as shown in FIG. 5 or a vacuum activated diaphragm 119 as shown in FIG. 5A, with different types of grippers being shown in FIGS. 5 and 5A for illustrative purposes. Considering specifically the vacuum actuated diaphragm 119 of FIG. 5A, the diaphragm 119 is positioned in a chamber 121 which is in communication with the air bearing via a channel 123, through the rotor 86 as shown. In operation, when the bearing 85 is pressurized, the chamber 121 is also pressurized via the channel 123. Pressurizing the chamber 121 causes the diaphragm 119 to flex to the concave position shown by the solid line in FIG. 5A. In this position, diaphragm 119 pushes downward on the gripper 90 to move the gripper 90 downward and into engagement with a wafer.

When rotation of the rotor stops and release of the wafer from engagement by the gripper 90 is desired, the valve 115 is positioned to couple the manifold arrangement 113 to the vacuum source 103. This arrangement causes a vacuum in the chamber 121 via the channel 123 which in turn, causes the diaphragm 119 to flex to the convex position shown in dotted lines in FIG. 5A. Such movement of the diaphragm 119 causes the gripper 90 to move from the position shown by solid lines upward to the position shown in dotted lines, thereby releasing the retained wafer (i.e., once the extractor 58 and guide 70 are in place to support the wafer).

Figure 5B:
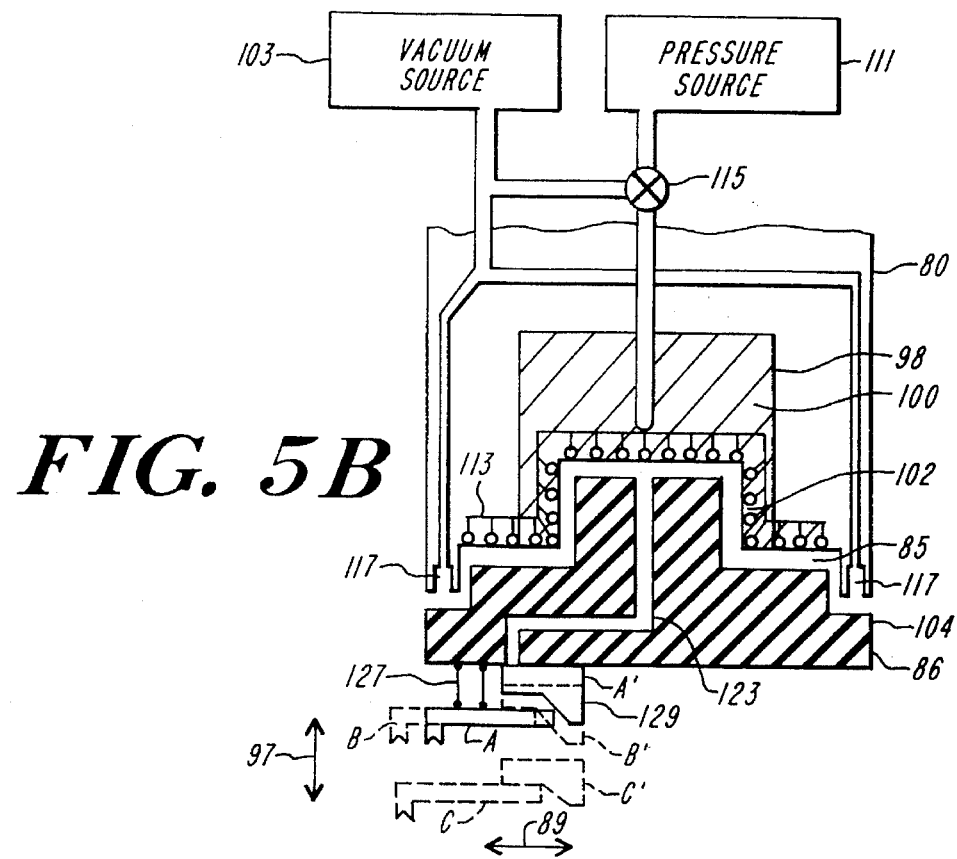
FIG. 5B is an expanded view of the air bearing and an alternate view of the gripper of the rotor subassembly of FIG. 5.

As is apparent from the above discussion of FIG. 5A, the diaphragm actuator 119 provides vertical movement of the gripper 90. It may be desirable to permit the grippers 90–94 to additionally move horizontally into and out of the plane of the wafer, labelled 101 in FIG. 5. To this end, an alternative actuator 129 for moving the grippers 90–94 is shown somewhat diagrammatically in FIG. 5B in conjunction with exemplary gripper 90. The gripper 90 is coupled to the rotor 86 by any suitable linkage(s) 127. The linkages 127 must be selectively flexible in order to permit the gripper 90 to move from the retracted position labelled A shown in solid lines in FIG. 5B through the position labelled B shown in dotted lines, and to the position labelled C also shown in dotted lines (and shown without the linkages 127 for clarity) in which a wafer is engaged by the gripper 90.

The channel 123 is in communication with the actuator 129 by any suitable mechanism so that pressure applied to the chamber 123 causes the actuator to move downward and a vacuum applied to the chamber causes the actuator to move upward. More particularly, in operation, in response to pressure introduced into the channel 123 by the pressure source 111, the actuator 129 is moved vertically from the position labelled A' shown in solid lines, to the position B' shown in dotted lines, and finally to the position C' also shown in dotted lines (and without coupling to the rotor 86 for clarity). In response to movement of the actuator 129 from position A' to position B', the gripper 90 is moved horizontally as indicated by arrow 89 to position B by contact with the slanted surface of the actuator 129, as shown. Thereafter, the actuator 129 is moved further downward to position C', whereupon the adjacent gripper 90 is concomitantly moved vertically as indicated by arrow 97 to position C in which a wafer edge is engaged. The actuator 129 is retracted to release the retained wafer by positioning the valve 115 to couple the vacuum source 103 to the channel 123 to draw the actuator 129 upward and permit the gripper 90 (which is normally biased to the retracted position A) to return to the retracted position.

In operation, once a wafer 22f is raised to a position so that the wafer is substantially vertically aligned with the central rotor aperture 88 (i.e., the measurement position in which wafer 22f is disposed in FIG. 5), the grippers 90–94 are actuated to move in the above described manner. Thereafter, the guide 70 and extractor 58 may be retracted upward and downward, respectively, leaving the wafer 22f in the support of the grippers 90–94 in the measurement position shown in FIG. 5. Note that engagement of the wafer edge by the grippers 90–94 may alternatively be achieved by pivoting such grippers 90–94, thereby eliminating the distinct horizontal and vertical movements of the grippers 90–94 along axes 89, 97, respectively.

An expanded view of an exemplary gripper 90 is shown in FIG. 5C. The gripper 90 has a V-shaped end portion 91, similar to the extractor portion 59 shown in FIG. 3A, for contacting the rounded edge of a retained wafer. The thickness of the exemplary wafer 22f is labelled $T_w$ and that of the gripper end portion 91 is labelled $T_g$. Preferably, the gripper end thickness $T_g$ is smaller than the wafer thickness $T_w$ thereby ensuring that the probe arms 54, 56 can be swung out of the circumference of the rotor aperture 88 without interference by the grippers 90–94.

It will be appreciated that various other arrangements for grippers 90–94 may be used, such as providing two grippers with fixed positions near the top of the rotor 86 and only one moveable gripper positioned at the bottom of the rotor. With such an arrangement, the wafer 22f may be raised vertically into direct engagement with the fixed, upper grippers. Thereafter, the moveable, lower gripper may be actuated to contact the lower edge of the wafer in order to retain the wafer.

Since the wafer 22f is held along its edge, it is desirable to ensure that any fiducial(s), or flat(s) 25 (FIG. 4) are not contacted by the grippers 90–94. To this end, a sensor 95 is provided (FIG. 3) to scan the wafer 22f prior to retention by the grippers 90–94. The sensor 95 provides an image of the wafer 22f which is analyzed to identify the location of the flat 25. Various types of sensors are suitable. For example, the sensor 95 may comprise an optical sensor to scan the wafer 22f as it is raised to the measurement position. Alternatively, a video sensor, or camera may provide an image of the wafer 22f once it is raised to the measurement position but prior to retention by the grippers 90–94. With this information, the rotor 86 is rotated prior to retention of the wafer by the grippers 90–94 in order to ensure that none of the grippers 90–94 contacts the flat 25. This arrangement of rotating the rotor 86 so that the grippers 90–94 avoid the flat 25 eliminates the necessity of transporting the wafers with a known flat orientation or rotating the wafers to a known orientation prior to loading into the measurement station. In many applications, subsequent wafer measurements provide information about the location of the flat 25 relative to the center of the wafer. This "probe measured" flat location may be used in addition to the sensor 95 determined flat position in order to improve the accuracy of flat position determination.

Once wafer measurements are completed, the operation of the transfer mechanism 40 is "reversed" to return the wafer 22f to the cassette 24b. That is, the extractor 58 and the guide 70 are raised and lowered, respectively, to contact the edge of the wafer 22f. The grippers 90–94 are then actuated to disengage the edge of the wafer 22f which is now supported by the extractor 58 and the guide 70 and to prevent the grippers from interfering with the lowering of the wafer 22f into the cassette 24b. When it is desired to measure another wafer, the cassette 24b is moved incrementally along the table 16 in order to vertically align another desired wafer with the slot 60.

In view of the above discussion of the transfer of wafers 22a–22n to and from the measurement station 12 and the handling of the wafers in the measurement station, it should now be apparent that throughout the transfer and measurement operations, the wafers 22a–22n are contacted only along their edges. Specifically, while the wafers 22a–22n are located in the measurement position, they are contacted only on the rounded portion of their edges at the locations of the grippers 90, 92, 94. Additionally, during transfer of the wafers 22a–22n between the cassettes 24a–24c and the measurement station, the wafers are contacted only on the rounded portion of their edges by the extractor 58 and the guide 70. Contact of the wafers 22a–22n only along the edges ensures that surfaces are not damaged over the area where semiconductor circuits may be formed. This arrangement reduces the potential detrimental effect of wafer contact, such as increased contamination and destruction. Additionally, restricting the contact of the wafers 22a–22n to the edges during measurement permits measurement coverage of the entire useable portion of the wafer.

Referring again to FIG. 3, each of the front and back rotary probe arms 54, 56 is disposed on an opposite side of the central aperture 88 of the rotor 86. With this arrangement, simultaneous measurement access to both the front and the rear sides of a retained wafer is provided, with the rear side of the wafer being accessible through the rotor aperture 88. Rotary probe arms 54, 56 are pivotally mounted to the measurement station 12 so that they can be swung out of the way of the rotor 86 as necessary to load and unload a wafer and can be moved across the wafer during measurements or other types of processing, as described below. More particularly, the measurement station 12 includes a motor 55 (FIG. 3) for rotating the arms 54, 56. The arms 54, 56 may be coupled to rotate together or alternatively, may be independently rotated.

Measurement components of the apparatus 10 (i.e., including the probe arms 54, 56 and the rotor subassembly 52), may be rigidly coupled to the wafer transferring apparatus, such as the measurement table 16 and the extractor 58. Alternatively, the measurement components may be "suspended" or "floated" so that relative motion is permitted between the wafer measuring apparatus and the transport apparatus. With the latter arrangement, vibrations experienced by the measurement table 16, for example, are decoupled from the floating probe arms 54, 56 and the rotor subassembly 52.

Each of the rotary probe arms 54, 56 includes a pair of wafer measuring probes 110, 112, respectively, and a pair of reference probes 114, 116, respectively, as will be described below. The wafer measuring probe pairs 110, 112 include individual wafer measuring probes 110a, 110b and 112a, 112b, respectively, which extend from the respective probe arms 54, 56 toward the rotor 86 interposed therebetween. Thus, each of the wafer measuring probes 110a, 110b associated with the front probe arm 54 has a corresponding wafer measuring probe 112a, 112b, respectively, associated with the rear probe arm 56. The reference probes 114, 116 are mounted to a side of the respective probe arms 54, 56 opposite the wafer measuring probes 110, 112 and toward the adjacent front and rear reference bars 48, 50 (FIG. 2), respectively. In the illustrative embodiment described herein, the wafer measuring probes 110, 112 and the reference probes 114, 116 are capacitive probes; however, other types of probes having other than capacitive sensors, such as those noted below, may alternatively be used.

In one application, each of the wafer measuring probes 110a, 110b, 112a, 112b provides a signal indicative of the capacitance between the probe and the adjacent wafer 22f and thus, also indicative of the distance between the probe and the wafer 22f. The corresponding ones of the wafer measuring probes 110a, 112a and 110b, 112b are in substantial alignment so that the distance indicating signals provided thereby can be processed to provide an indication of the thickness of the measured wafer.

Figure 3B:
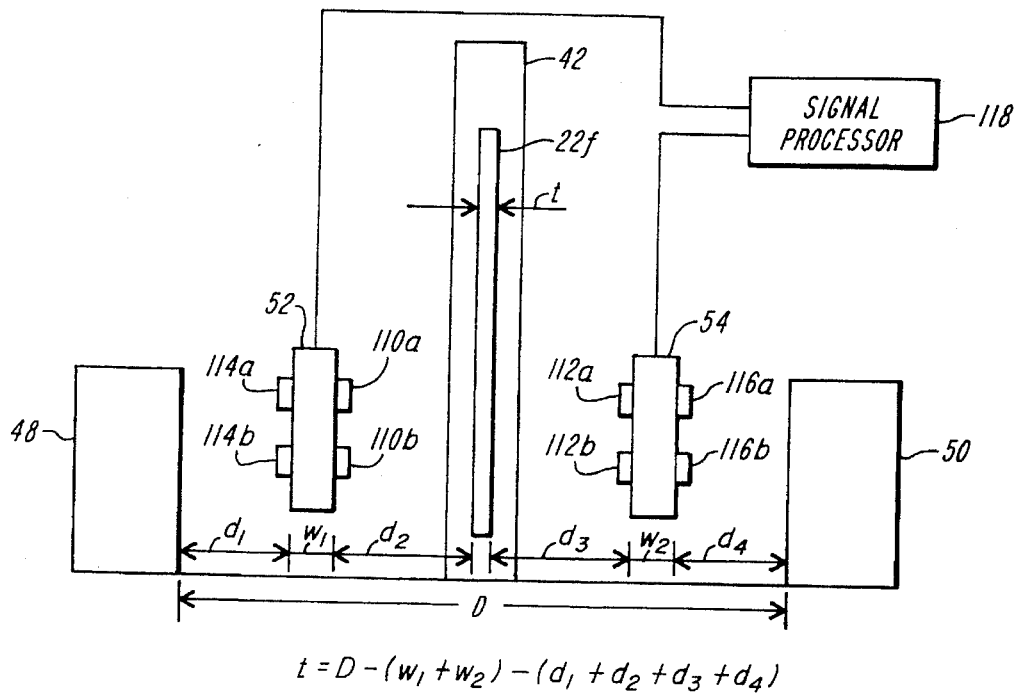
FIG. 3B is a diagrammatical view of the apparatus of FIG. 3.

More particularly, referring to the diagrammatic representation of FIG. 3B, a signal processor 118 receives the distance indicating signals from each of probes 110, 112, 114, and 116, indicating distances $d_1$, $d_2$, $d_3$, and $d_4$. More particularly each of the reference probes 114a, 114b provides a signal indicative of the distance $d_1$ and each of the reference probes 116a, 116b provides a signal indicative of the distance $d_4$. Similarly, wafer measuring probes 110a, 110b each provides a signal indicative of the distance $d_2$ and wafer measuring probes 112a, 112b each provides a signal indicative of the distance $d_3$. Since the position of reference bars 48 and 50 is fixed, the total distance D between the bars 48, 50 is known. The signal processor 118 subtracts the measured distances $d_1$–$d_4$ and the known widths $w_1$, $w_2$ between opposing capacitive and reference probes from distance D, in order to obtain the thickness "t" of the wafer 22f as indicated by the equation in FIG. 3B.

It is to be understood that various types of wafer measurements in addition to wafer thickness can be made with the apparatus described above or variations thereof noted below, such as micro-roughness, particulate contamination, heavy metal contamination, and film thickness measurements. Wafer flatness can be measured as described in U.S. Pat. No. 4,860,229 of the assignee of the subject invention and incorporated herein by reference. Also, wafer bow and warp can be measured as described in U.S. Pat. No. 4,750,141 of the assignee of the subject invention and incorporated herein by reference.

Moreover, the apparatus described herein may be suitable for carrying out wafer processing steps other than making wafer parameter measurements. For example, a laser beam may be directed to predetermined wafer locations for marking the wafer. Alternatively, having identified particle contamination at a particular wafer location, the wafer may be subjected to ultraviolet radiation to achieve charge separation and air directed over the wafer to remove the contaminating particles.

Figure 7:
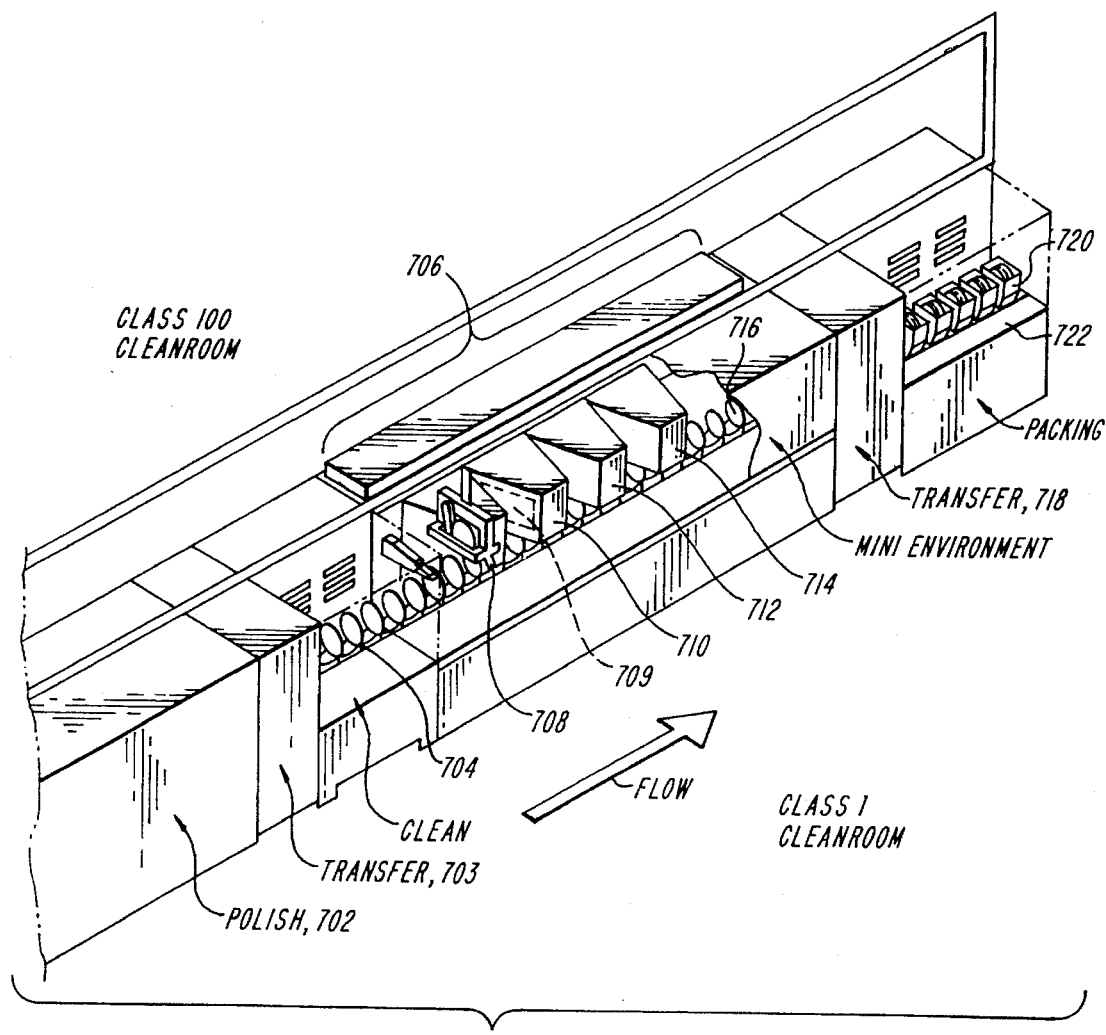
FIG. 7 is a diagrammatic view of a multi-measurement station type processing on a single wafer processing basis.

In order to enhance the versatility of the described apparatus, various probes with different sensor types may be coupled to the rotary probe arms 54, 56, such as eddy current probes or surface photovoltage probes. Alternatively, the rotary probe arms 54, 56 may be removed from the measurement station altogether and replaced with other types of wafer sensing and processing apparatus, referred to herein generally as wafer sensors. For example, optical measurements can be made with a laser source for generating a laser beam and detectors for detecting the scattered light. Such wafer sensing apparatus may be coupled to the measurement station by any suitable means. For example, such apparatus may be supported by the support bridge 42 or alternatively may be mounted to the interior of a housing 709 covering a station 708 for example, as shown in FIG. 7. The laser may be stationary relative to the support bridge 42 and the retained wafer rotated by the rotor 86 in order to achieve a desired scan of the wafer. Alternatively, the light beam may be effectively moved relative to a stationary wafer by a plurality of moveable mirrors in order to achieve a desired scan pattern (i.e., thereby eliminating the need for wafer rotation).

Various wafer scanning schemes are achievable with the above described apparatus in order to provide a desired wafer scanning pattern. In the case where the measurement station is equipped with the rotary probe arms 54, 56 of FIG. 3, the rotor 86 and retained wafer may be rotated relatively fast while the probe arms 54, 56 traverse across the wafer relatively slowly. This type of scanning arrangement results in a pattern of concentric circles of the type shown in FIG. 4A when the rotor rotation is intermittent or, alternatively,, results in a spiral pattern of the type shown in FIG. 4B when the rotor rotation is continuous. Alternatively, the wafer may be rotated relatively slowly and the probe arms 54, 56 moved relatively quickly across the wafer in order to obtain the scanning pattern of the type shown in FIG. 4C.

Figure 4E:
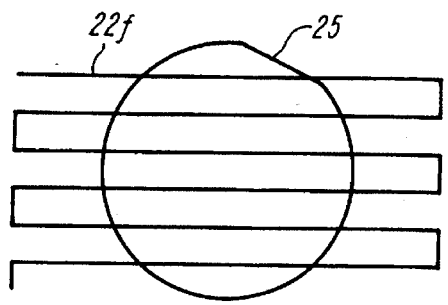
FIG. 4E is further wafer scanning pattern achievable with the apparatus of the present invention.
Figure 4F:
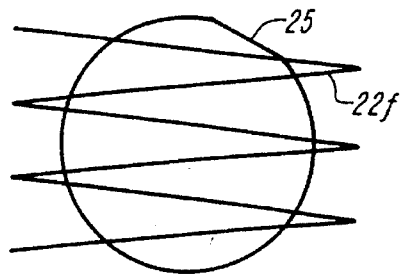
FIG. 4F is another wafer scanning pattern achievable with the apparatus of the present invention.

Further wafer scanning patterns are achievable with the use of the alternative wafer sensing and processing apparatus described above, such apparatus being supported in a manner other than with the probe arms 54, 56. For example, a pattern of the type of FIG. 4D may be obtained with the use of a pivoting mirror to reflect a laser beam and direct the beam onto a retained wafer as the wafer is rotated by the rotor. In applications in which the wafer is not rotated at all, such as in the case of a laser beam scan of the wafer with the use of two moveable mirrors, patterns of the types shown in FIGS. 4E and 4F can be obtained. The patterns of FIGS. 4E and 4F may alternatively be achieved by scanning a wafer with a horizontally traversing light beam as the wafer is moved upward in discrete steps or continuously, respectively, from a cassette to the measurement or retention position, such as by the transfer mechanism 40 described above.

Referring again to FIG. 5, additional sensors 120 are provided to compensate for wobble, or vibration experienced by the rotor 86 in order to enhance the accuracy of wafer surface position measurements. Wobble may cause the rotor 86 to tilt such that the plane 101 of a retained wafer deviates from a fixed reference plane. Any wobble of the rotor 86 cancels out in measurements of wafer thickness (i.e., since the front and rear capacitive probes 110, 112 move the same distance relative to the wafer but in opposite directions). However, when the position of either or both surfaces of the wafer is measured, the absolute distances of the front and rear probes 110, 112, respectively, to the wafer are critical.

In order to remove the effect of rotor wobble on wafer shape measurements, three wobble correcting sensors 120 are provided and used to determine the plane of the rotor 86. The wobble sensors 120 are coupled to the stationary housing 80 at three positions around the circumference of the rotor 86 and measure the absolute distance to the rotor 86. With this information, any deviation of the rotor plane from a fixed reference position is provided to the signal processor 118 and is used to compensate wafer surface position measurements accordingly.

More particularly, the goal is to measure the position (along the z-axis) of a wafer surface at multiple points x, y relative to a fixed xy plane such as the measurement position plane 101. The x, y, and z axes are as labelled in FIG. 5 with the x-axis being orthogonal to the page. If both the wafer support and the surface position sensor are fixed in z as the multiple measurements are made, then the sensor output $z_o(x, y)$ will be an accurate representation of the wafer surface position $z_w(x, y)$. However, the wafer support, such as the rotor 86, may exhibit rigid body motion in z as the multiple points are scanned and the corresponding multiple measurements made. Therefore, the (corrupted) sensor output will be:

$$z_o(x,y)=z_w(x,y)+z_s(x,y) \quad (1)$$

where $z_s(x,y)$ corresponds to a fixed reference position plus the change in position of the wafer surface at x, y due to the motion of the support relative to the probes. If the position of the support is measured (by the wobble correction sensors 120) at three points around the rotor periphery ($x_1,y_1, x_2,y_2, x_3,y_3$), then the position change at any point x, y can be calculated. These measurements must be made simultaneously with the surface position measurement $z_o(x, y)$ at the position x, y.

A plane is defined as:

$$z(x,y)=ax+by+c \quad (2)$$

The variables a, b, and c can be calculated by solving the following simultaneous equations corresponding to wobble correction sensor measurements taken simultaneously with the ith measurement:

$$z_{s,i}(x_1,y_1)=a_ix_1+b_iy_1+c_i \quad (3)$$

$$z_{s,i}(x_2,y_2)=a_ix_2+b_iy_2+c_i \quad (4)$$

$$z_{s,i}(x_3,y_3)=a_ix_3+b_iy_3+c_i \quad (5)$$

The motion of the wafer support relative to the probe support at the ith measurement location can then be written as:

$$z_s(x,y)=a_ix+b_iy+c_i \quad (6)$$

The position of the wafer surface independent of support motion can then be computed by:

$$z_w(x,y)=z_o(x,y)-z_s(x,y) \quad (7)$$

which provides the desired wafer surface position measurement.

The apparatus of FIGS. 1–5 may be calibrated by various techniques. One calibration technique includes the steps of determining one or more parameters associated with the various measuring components, such as the capacitive probes 110, 112, and the reference probes 114, 116, and providing such parameters to the signal processor 118 for use in computing the measured wafer characteristics in the manner described in co-pending U.S. patent application entitled "Apparatus And Methods For Measurement System Calibration", Ser. No. 08/052,384 of the assignee of the subject application, and incorporated herein by reference.

As noted, the gage block 73 of the housing 80 is also used to calibrate the measurement apparatus. More particularly, the gage block 73 provides a reference thickness for mastering the probes whereby measurements by the probes 110, 112 of the thickness of the gage block 73 are compared to the predetermined, known gage block thickness in order to calibrate the probes.

Regardless of the type of wafer measuring or processing apparatus contained in the above described processing station, of particular advantage is the processing of a plurality of wafers sequentially through a number of different wafer processing stations in one single sequence without the resort to prior art intermediate handling or human transport between processing stations and different factory locations, further with a view to assembling a permanent database record of wafer characteristics as measured from each station. More particularly, the sequential processing stations will generally include different types of probes or other wafer sensing or processing apparatus in order to provide a comprehensive sequence of wafer processing steps and measurements.

FIG. 6 illustrates diagrammatically one view in which, for example, such a combined testing assembly 602 is fed cassettes 604 of vertically stacked wafers at an input station 606 from a cassette conveyor 608. The cassettes 604 travel through plural testing stations such as flatness station 610, resistivity or conductivity type station 612, to an output station 614 where the vertically stacked wafers are transferred by a transfer system 616 to a cassette shuttle 618 which accomplishes wafer sorting into a plurality of output cassettes in an assembly 620 using a wafer transfer arm 622 which places wafers from cassettes in the shuttle 618 into sorted output cassettes in assembly 620 according to measurement criteria from the measurement stations 610, 612, . . . as identified by controller 624. Once the wafers have been placed in the cassettes at assembly 620, the full cassettes are transferred to other locations on a conveyor system 626, based upon measurement data. In particular, some wafer processing procedures may require tighter tolerance of certain parameters whereas other procedures may be able to accept less tightly controlled parameters. The sorting accomplishes the categorizing of the wafers in accordance with any desired constraints to permit most efficient use of wafers.

The batch processing of wafers and cassettes illustrated in FIG. 6 may be alternatively accomplished utilizing a single wafer processing technology as illustrated in FIG. 7 showing a cleanroom compatible multi-measurement station arrangement utilizing single wafer at a time processing. As shown, wafers 716, after completing their initial fabrication, typically ending in a polishing station 702, are conveyed to a transfer station 703 in which such wafers are transferred to individual wafer holders, or carriers of the type shown in FIG. 7A.

Figure 7A:
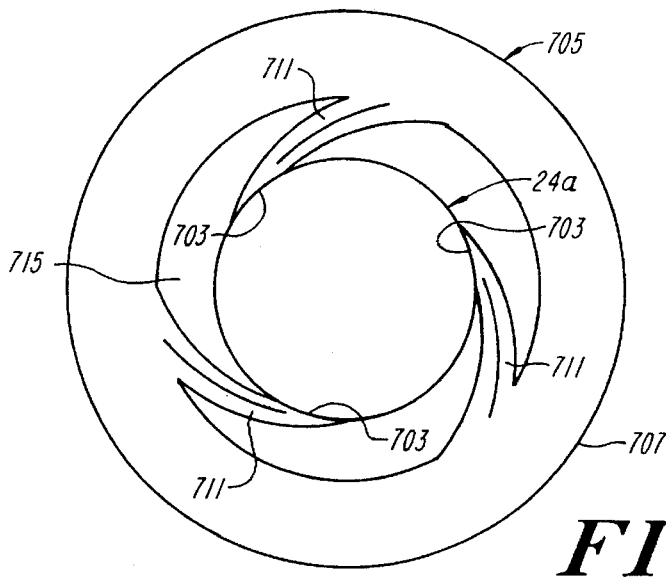
FIG. 7A is a plan view of an exemplary individual wafer carrier for use with the multi-measurement station type processing of FIG. 7.

Referring to FIG. 7A, an illustrative wafer carrier 705 is shown to have a round outer edge 707 having substantially the same shape as a wafer and a central aperture 715 for receiving a wafer, such as exemplary wafer 22f. The carrier 705 includes a plurality of wafer retention portions 711 extending into the central aperture 715 as shown. The wafer retention portions 711 are resilient or slightly moveable so that sufficient pressure is applied to the edges of a retained wafer to maintain the wafer securely in the carrier 705 and so that the retention portions 711 may be moved or biased to release a retained wafer 22f. To this end, the wafer retention portions 711 may comprise bimetallic springs which expand or retract in response to appropriate heating and cooling in the transfer stations 703, 718 into and out of engagement with a wafer placed in the central aperture 715. Alternatively, the retention portions 711 may be comprised of magnetostrictive materials, such as bimetallic nickel-iron elements, which are moveable in response to the application of an appropriate magnetic field in the transfer stations 703, 718.

The end portions 713 of the carrier retention portions 711 contact only the rounded edge of a retained wafer 22f in the same manner as the extractor 58, guide 70, and grippers 90–94 described above. That is, the end portions 713 are provided with a V-shaped portion, like portion 91 of the gripper 90 shown in FIG. 5C.

The wafer carriers 705 may be comprised of any suitable material in view of cost and contamination considerations. For example, an outer portion of the carrier 705, from which the retention portions 711 extend, may be comprised of plastic. The wafer-like exterior edge of carrier 705 of FIG. 7A is advantageous since the mechanisms discussed above in conjunction with FIGS. 1–5 are suitable for vertically transferring the carrier 705 from a conveyor to the measurement position of a measurement station in the manner discussed. However, it should be appreciated that various shapes and wafer retention arrangements may be suitable for the individual wafer carriers.

The wafers 716 are transported from the transfer station 703 along a conveyor 704 in the carriers 705. More particularly, the conveyor 704 includes a mechanism for vertically supporting the wafer carriers 705 for transport. From the transfer station 703, the wafers are transported to a measuring area 706 in which a plurality of vertical wafer measurement stations 708, 710, 712, 714 . . . act upon each wafer in the conveyor chain, as previously described. After completion of the testing sequence, the wafers 716 on the conveyor 704 enter a second transfer station 718 where they are removed from the individual wafer carriers 705 and placed, in sorted or unsorted condition, into plural cassettes 720 in a cassette transport station 722 from which they may be conveyed elsewhere for further processing or shipment to customers, such as semiconductor integrated circuit manufacturers. An advantage of the wafer carriers 705 and the accompanying individual wafer conveyance shown in FIG. 7 is that the wafers are not repeatedly engaged and disengaged reducing handling and contamination.

Figure 8:
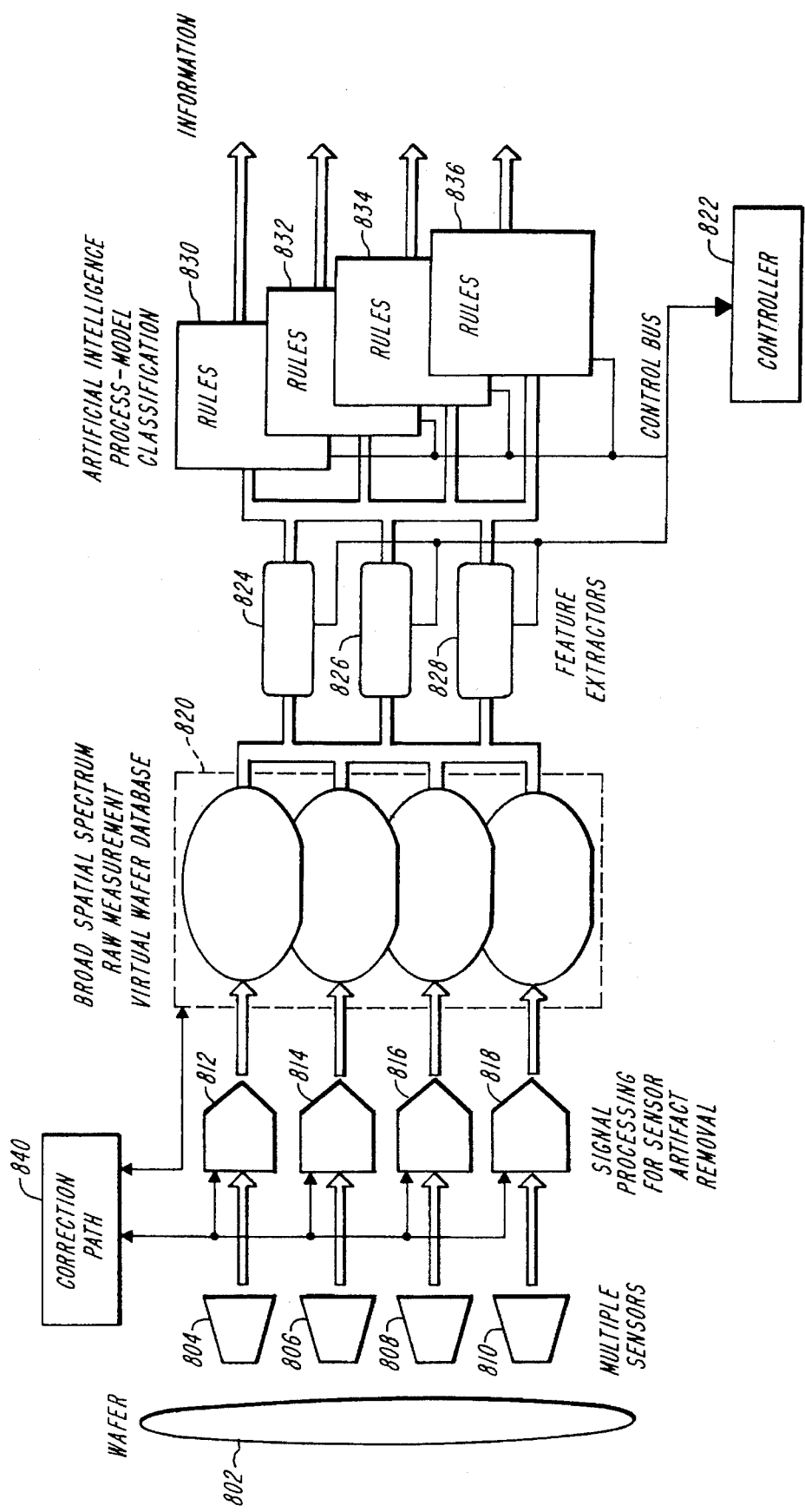
FIG. 8 is a block diagram of data processing utilizing multiple measurement outputs and cross-correlated wafer data analysis.

FIG. 8 illustrates a data assembly and analysis technique according to the invention for assembling a permanent record of wafer data across a plurality of sensor tests and for accessing data from more than one test to do a more comprehensive characterization of wafer parameters. As shown, a wafer 802 is processed, according, for example, to the multiple measurement station systems of FIG. 6 or 7, by a plurality of sensors 804, 806, 808, 810 . . . and the output of the sensors processed in respective signal processing systems 812, 814, 816, 818 . . . for removing various measurement artifacts and errors, as discussed below. The resulting data from the plurality of tests for each wafer are assembled in a permanent database 820. It is a feature of the invention that data are preserved at this level for each wafer, because it represents the most comprehensive level of data available and from it more sophisticated wafer characteristics and other information can always be derived on demand as illustrated below.

The data contained in the permanent database 820 can be further processed under the control of a computer controller 822 which activates one or more of a plurality of information extractors 824, 826, 828 . . . , such as for accessing the data from all locations of a single wafer which may represent the possible existence of a dimple on the wafer surface. The data thus extracted are further processed by one or more rules implemented by processing algorithms 830, 832, 834, 836 . . . . For example, in the case of extraction of data representing wafer dimples, which may have been obtained from both thickness and optical reflectivity measurements, the rules applicable to such feature detection would be activated to process the raw data from the extractors 824, 826, 828 . . . in order to determine the existence of a dimple at each wafer location having the potential therefor.

Figure 9:
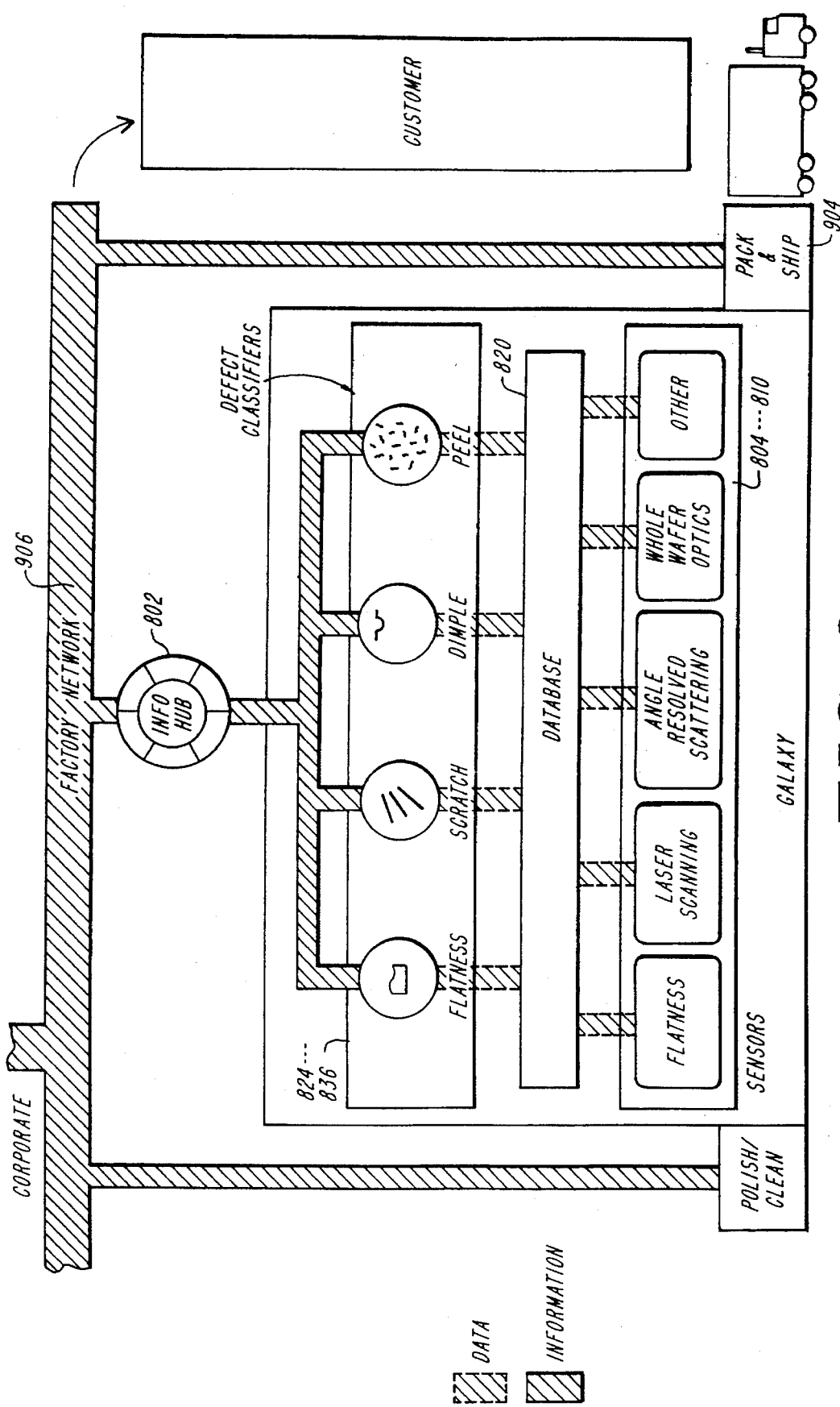
FIG. 9 is a processing diagram illustrating the organization of a total testing station as a part of a semiconductor wafer processing factory.

FIG. 9 illustrates the data analysis system of FIG. 8 in a more comprehensive factory environment in which the data obtained from the sensors 804 . . . 810, as applied to database 820, and analyzed in the feature extractors and rules 824 . . . 836 . . . result in output information of wafer defect or other characteristics which can be applied to an information network 906 via an information hub (INFOHUB™) 902 simultaneously with the wafers exiting the measuring station and being shipped in a shipping station 904 for subsequent customer use. In particular, it is important to recognize that the database 820 illustrated in FIGS. 8 and 9 may be one of plural databases distributed throughout an entire factory or even more than one factory or other processing facility and it is a feature of the invention to draw such information together through a network 906 for access at distributed user terminals, as described below.

Figure 10:
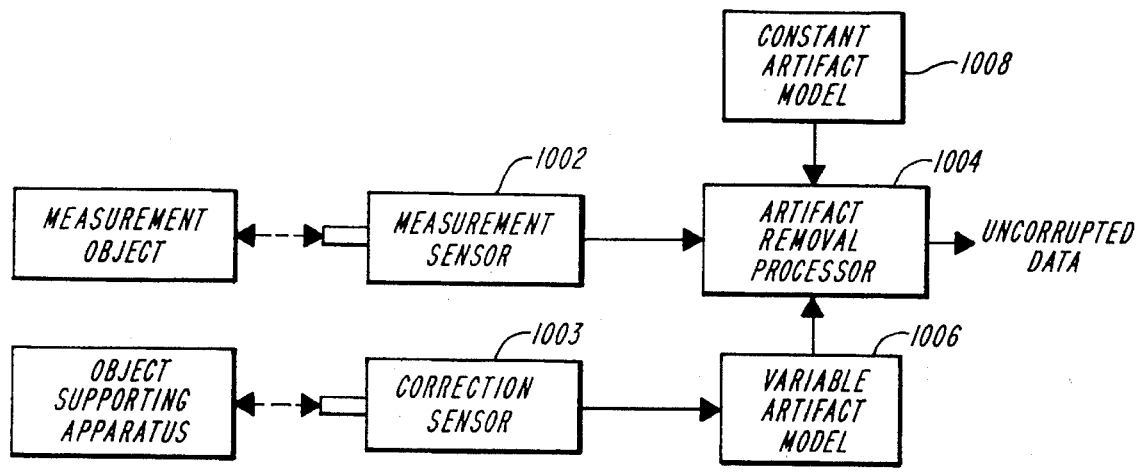
FIG. 10 is a block diagram of sensor output processing according to FIG. 8.

Returning to FIG. 8 the sensor data from sensors 804 . . . 810 are processed in the signal processors 812 . . . 818 according to corrective information in a database 840. The data in database 840 are obtained by calibration and other techniques, as more fully described in FIG. 10, based upon the output of a single exemplary sensor 1002. The output of the sensor 1002, corresponding to one of the sensors 804, 806 . . . , is applied to an artifact removal processor 1004 corresponding to the signal processors 812, 814 . . . for model-based removal of various sources of corruption of the measured wafer data. In particular, the artifact removal system 1004 utilizes known technology to provide a number of corrections as, for example, represented by the U.S. Pat. Nos. 4,931,962, 4,849,916, 4,750,141, 4,217,542, 3,990,005 3,986,109, and 3,775,679 of the assignee of the present application and incorporated herein by reference.

More particularly, the sources of data corruption which cause measured wafer data to deviate from a "perfect" indication of the measured wafer parameter may be categorized generally into those of a variable type and those of a constant type. More particularly, constant artifacts are generally determinable by modelling the "rule" by which the data corruption occurred and obtaining details, or parameters associated with the rule by known techniques, such as calibration. That is, knowledge of the rule by which the error occurred permits "reversal" of the rule's operation on the measured data by the artifact removal processor 1004. Calibration correctable errors are exemplary of constant artifacts in which knowledge of the calibration methodology provides knowledge of the data corruption rule and the calibration process provides the variables associated with the calibration rule. For example, where known calibration techniques are used to determine that a scale factor is necessary to render the measured wafer parameter data an accurate indication of the actual wafer parameter, the constant artifact model 1008 provides such scale factor information to the artifact removal processor 1004 for application of the scale factor to the measured data. As a further example, where probe limitations, such as the geometry of the probe, cause the measured data to be a convolution of the actual wafer parameter, the constant artifact model 1008 provides convolution information to the artifact removal processor 1004 for deconvolution of the measured data.

Variable artifacts on the other hand are not determinable in the same manner as constant artifacts but may be nevertheless be modelled by a variable artifact model 1006. More particularly, such variable artifacts generally refer to data corruption sources that can be modelled in response to a measurement obtained with a correction sensor 1003. Wobble of the rotor 86 is an example of a variable artifact in which the wobble sensors 120 comprise the correction sensor 1003.

The artifact removal processor 1004 receives data regarding variable artifacts from the variable artifact model 1006 and also data relating to constant artifacts from the constant artifact model 1008 (i.e., such data being stored in the database 840 of FIG. 8) and processes the measured wafer data in accordance with such received data. The output of the artifact removal system 1004 is substantially uncorrupted wafer data (i.e., an approximation of "perfect" wafer data). The output from the artifact removal processor 1004 is provided to the database 820 which thus represents within the accuracy of the system, wafer data corrected for all errors and corruptions. This makes the database 820 of particular value as a permanent record since it represents the real wafer in a virtual, or data domain.

Figure 11:
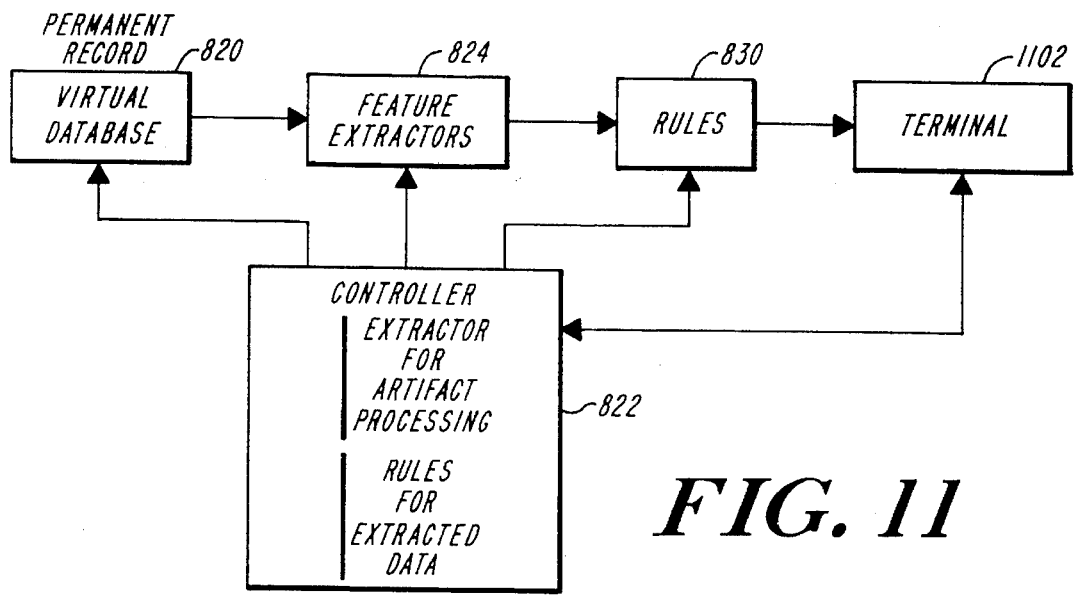
FIG. 11 is a block diagram illustrating processing of wafer data obtained according to FIG. 8.

To illustrate the operation of the present invention with respect to the analysis of data in the permanent record of the virtual database 820, reference is made to FIG. 11. As illustrated there, a user at a terminal 1102 may request through controller 822, for example, an indication of dimples on all or selected wafers whose data are stored in the virtual database 820. For this purpose the controller 822 activates appropriate feature extractors 824, 826 . . . (FIG. 8) to search for and extract data indicating the possible presence of wafer dimples based upon the different measurements providing output data that could reflect dimples. For example, both a thickness measurement as well as an optical reflectivity measurement could produce output data having abnormalities that potentially reflect wafer dimples. The feature extractor 824 would thus access data in database 820 from both the thickness measurement and the optical reflectivity measurement which are indicative of a dimple characteristic.

Figure 12A:
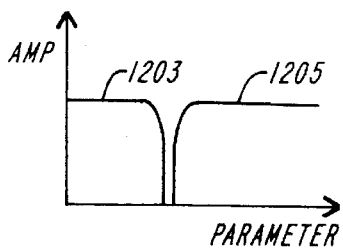
FIG. 12A is a graph illustrating the use of the processing of FIGS. 8 and 11 for characterizing wafers based upon multiple sensor data.

FIG. 12A illustrates data from multiple sensors, such as a thickness sensor and an optical reflectivity sensor, which may be used by a wafer dimple detecting feature extractor. More particularly, curve 1203 represents the sensitivity of thickness measurement data to a particular parameter, such as spectral wavelength, while curve 1205 represents the sensitivity of optical reflectivity measurement data to the same parameter. As is apparent from illustrative curves 1203 and 1205, each of the sensors (i.e., the thickness sensor and the optical sensor) provides data over a different range of the particular parameter. The ranges may or may not overlap. Stated differently, either sensor alone may not be capable of providing wafer characteristic information to a desired accuracy or over a desired range of interest. The controller 822 executes predetermined software rules on the data represented by curves 1203, 1205 in order to provide desired wafer information. In accordance with one such software rule, the controller 822 uses a combination of the data from both sensors to compute the number of dimples on a particular wafer. Weighting of the different sensors output or other more sophisticated techniques may be used.

Figure 12B:
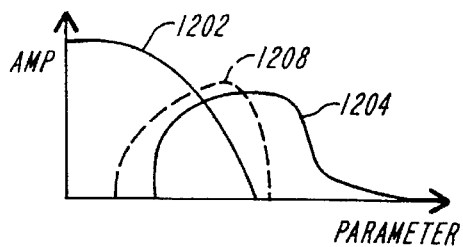
FIG. 12B is a graph illustrating an alternate use of the processing of FIGS. 8 and 11 for characterizing wafers based upon multiple sensor data.

FIG. 12B illustrates alternative output data provided by multiple measurement sensors. Here again, the curve 1202 represents the sensitivity of a thickness sensor to a particular parameter and curve 1204 represents the sensitivity of an optical sensor to the same parameter. It should be appreciated that the level of sophistication of the software rules performed by the controller may be varied to achieve a desired level of accuracy or as may be necessary to accommodate the sensitivity or response of the sensors from which data are extracted.

In another example of the use of data from multiple sensors, the curves of FIGS. 12A or 12B represent a domain transform of sensor output data. For example, curves 1202 and 1204 of FIG. 12B may represent the Laplace transform of the output data from different sensors. In this case, the controller 822 may activate a filtering software rule to provide a characteristic transform curve 1208 in the frequency domain which bounds the thickness and optical data and searches for weighted coincidences or other rule-based correlations that identify the likely occurrence and characteristics of a dimple with a higher accuracy.

Other analyses may utilize different combinations of plural sensor outputs stored in the database 820, or for that matter, in the case of distributed databases 820 described below, may utilize data from those various distributed databases to provide a multi-sensor data analysis whereby the information sought is a function of plural sensor outputs, thus greatly enhancing the value and accuracy of the information processing.

Figure 13:
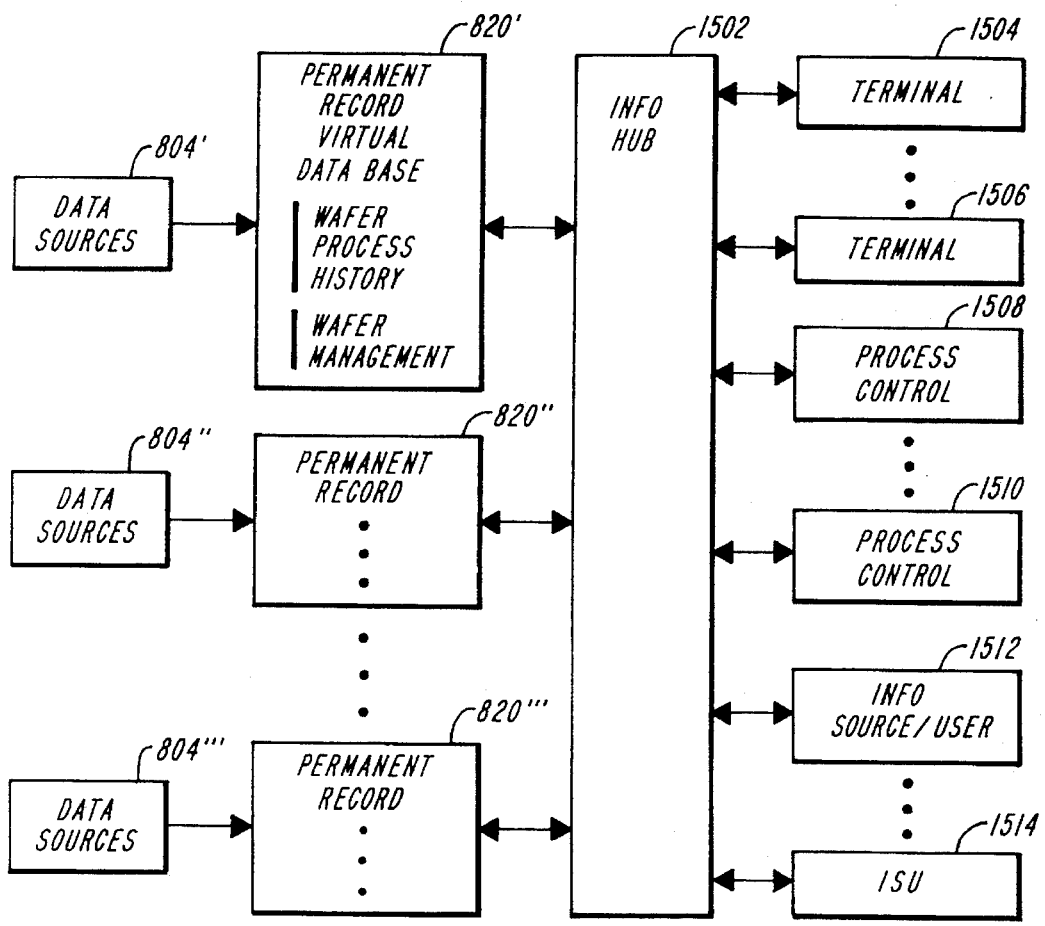
FIG. 13 is a block diagram of a data networking of a wafer information system based upon information collected according to FIG. 8.

Referring to FIG. 13, plural databases 820, such as databases 820', 820'' . . . 820''', are typically distributed throughout a factory and may be fed data from plural distributed data sources, such as factory performance or measurement systems 804', 804'' and 804''' respectively. For example, the tables 820 . . . will respectively accumulate semiconductor process equipment operating condition data along with wafer test data, such as circuit test data, at various stages of manufacture. Thus the stages of fabrication for a single wafer will be distributed over many Tables 820. An information hub 1502 (INFOHUB™) is provided in the nature of a software and/or hardware entity for linking and coordinating sources and users, including not only of the distributed databases 820' . . . but also of terminals 1504, 1506 . . . as well as various factory process controls 1508, 1510 . . . and other factory information sources, interpreters, or utilizers 1512, 1514 . . . , of wafer information.

Figure 14:
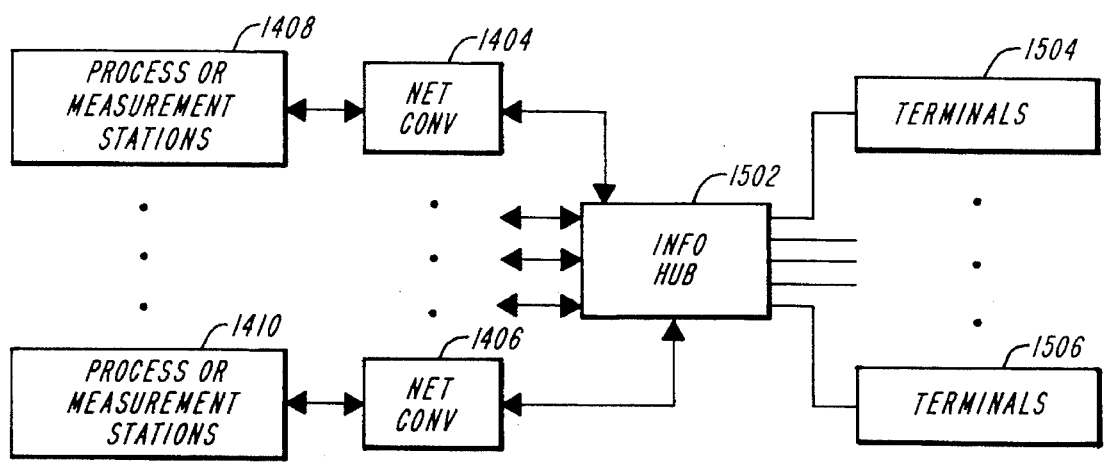
FIG. 14 is a block diagram illustrating the extension of FIG. 13 into different database environments.

In the typical case, where the control and test equipment to be networked as well as the terminals to access the network may be built on different platforms and operating systems, it will be necessary, as illustrated in FIG. 14, to have a network such as INFOHUB™ 1502 run through network converters or gateways 1404, 1406 . . . to the various process, control or measurement stations 1408, 1410 . . . . While similar converters may be necessary to place terminals 1505, 1506 in communication over the INFO-HUB™ 1502, these may be more readily replaced or otherwise engineered to reside directly on the network 1502.

Figure 15:
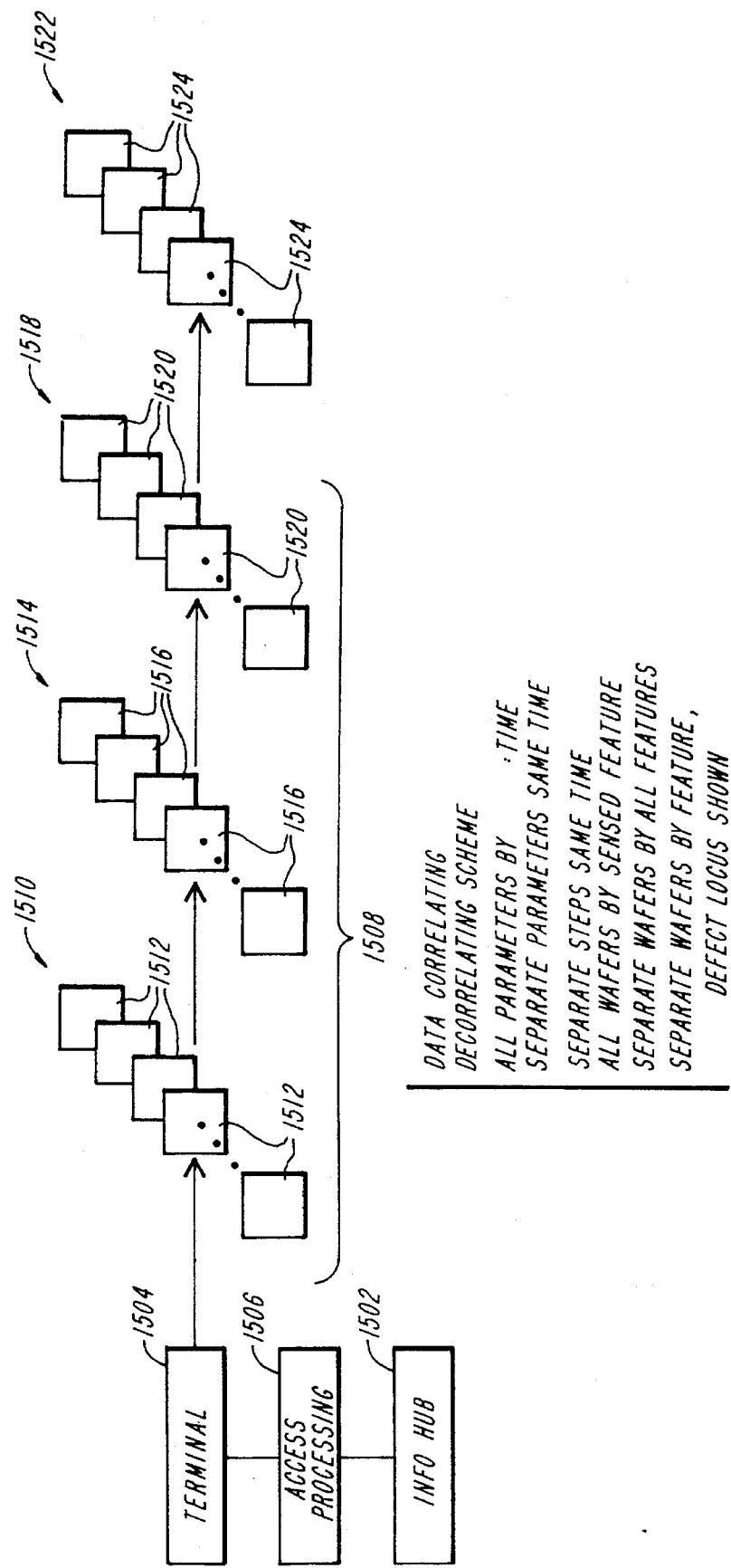
FIG. 15 is a processing diagram illustrating analytical processing for a semiconductor wafer factory to find and identify the nature of processing defects and abnormalities.

One of the advantages of providing an entire semiconductor processing facility, whether it be a wafer fabrication facility, a semiconductor device manufacturing facility, or a combination of the two as shown in FIG. 15, with the ability to access all information through the INFOHUB™ 1502, or several of them if the information is sufficiently dispersed, is to enable an operator of a user terminal 1504 to view and diagnose plant processing deviations in order to provide early corrective action. For example, access processing hardware and/or software 1506 is structured according to a data correlating and decorrelating scheme 1508 to access all the database records 820 throughout the system according to desired search parameters. Such a search displays on a by-time basis, such as day-by-day, in a display format 1510, the degree of normalcy, indicated by color or other coding of icons 1512. One icon may for example correspond to one day of processing thereby indicating days where sensed measurement parameters from the measurement system of FIG. 8 or other process control parameters, depart from normalcy. The icons 1512 further indicate the degree to which the particular sensed measurement parameter or other process control parameter departs from normalcy such as through ranges of caution, danger, or alarm.

An additional display 1514 can be driven by processing in the terminal 1504 under the control of the access processing software 1506 in order to select one such daily combined icon 1512 where, for example, one or more of the icons 1512 represents a departure from normalcy. Selection of an icon 1512 expands that day to show each icon contributing parameter separately in display icons 1516 where shading, coloring, or other coding of icons 1516 indicates out of tolerance data. Similarly, a display 1518 can be utilized to analyze the processing steps in the process of wafer production or integrated circuit fabrication based upon the data distributed throughout the system. That is, each of a series of separate icons 1520 represents a separate major step of wafer processing. Icons 1520 are in turn expandable in a display 1522 with separate icons 1524 representing each mini step and shading coloring, or other coding representing the existence and degree of out-of-tolerance measurement results, thereby permitting instant localized spotting of factory errors.

Similarly, the system access processing software 1506 is utilized to provide a display, such as the display 1510, showing, for example, a display of all wafers by the different, sensed parameters with each icon 1512 representing a different sensed parameter and the color and/or shading representing the degree or frequency of out-of-tolerance occurrences of each parameter across all wafers. Similarly, the displays can be expanded as shown above through the access processing software 1506 to provide in each icon separate wafers with the level of error across all features represented by the shading or coloration. The display can be further expanded so that each icon represents a single wafer and a single sensed feature with the presence of any defects or out-of-tolerance positions localized by colored or shaded spots on the icon. In the case of the latter representations, the icons, rather than being in a file shape, are preferably in the shape of actual wafers such that the positional location of defects can be easily shown and the appearance of defects in the same locus across several wafers may yield a clue to process errors.

Figure 16:
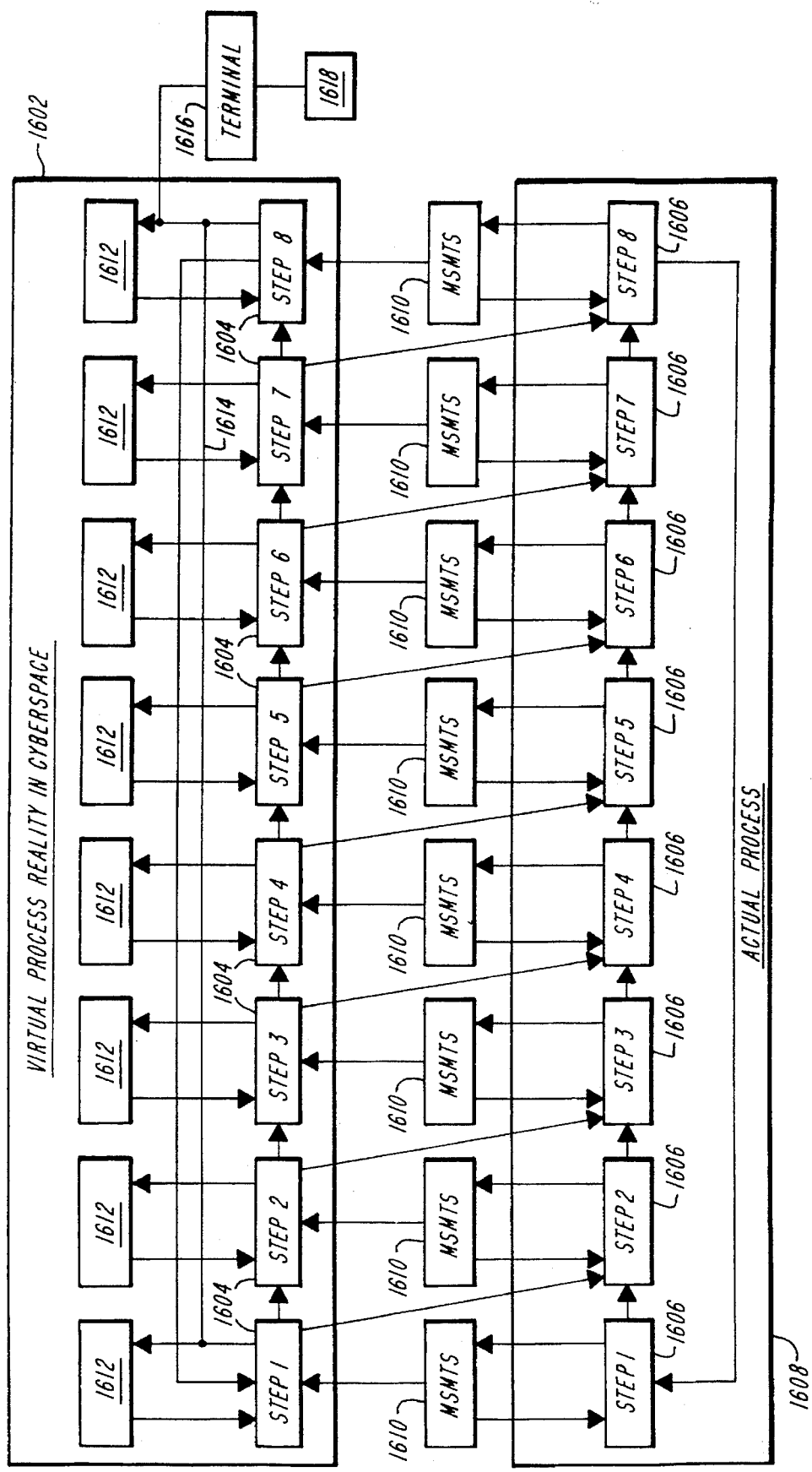
FIG. 16 is an illustration of a semiconductor wafer processing factory control system utilizing real time simulation deviation detection and correction techniques.

FIG. 16 illustrates the utilization of a real time simulation, of the type typically utilized to represent individual or small numbers of processing steps in the design of a semiconductor processing facility. As shown there, such state of the art simulations are joined into a single large simulation 1602 which represents the entire factory operation comprising a series of mini-steps 1604 which represent the respectively practiced steps of photolithography, layer growth or oxidation, diffusion, ion implantation, etching, etc., which are utilized time after time in different arrangements to produce the typical integrated circuit. The steps 1604 mimic as accurately as computer simulation can, the actual steps 1606 of the real time factory process 1608, practiced throughout the factory, for the development of an integrated circuit or other semiconductor wafer processing. A series of measurements of comparison stations 1610 are utilized to compare the results of the real process steps 1606 to the idealized simulation steps 1604 and discrepancy data accumulated in databases 1612. The databases 1612 are networked on an information hub 1614 where they may be accessed by one or more terminals 1616 which include appropriate processing to make decisions for corrective steps based upon the identified discrepancies in each simulation step 1604 versus each real step 1606 in the process. Corrections are applied from the intelligent processing of the indicated discrepancy, such as through the use of artificial intelligence, to change processing in a step 1606 of the actual process either ahead or behind (i.e., in a feedforward or a feedback manner) or at the same level according to known information, which is, for example, stored in an associated database 1618 of corrective steps known to overcome each measured discrepancy.

Having described preferred embodiments of the invention, it will be apparent to one of skill in the art that other embodiments incorporating their concepts may be used. Accordingly, the invention should be limited only by the spirit and scope of the appended claims.

We claim:

1. Apparatus for handling a disk comprising:

a housing;

a rotor disposed in said housing and having a central aperture for receiving said disk, said rotor having at least one gripping mechanism for retaining said received disk in a measurement position;

a sensor for determining the location of a fiducial on said disk; and a motor for rotating said rotor relative to said housing, wherein said motor is operable to rotate said rotor prior to said gripping mechanism retaining said disk so that said gripping mechanism avoids said fiducial when said disk is retained.

2. The apparatus recited in claim 1 wherein said rotor retains said disk in a substantially vertical orientation.

3. The apparatus recited in claim 1 further comprising a pair of probes for measuring a characteristic of said disk, a first one of said probes being adjacent to a front surface of said received disk and a second one of said probes being adjacent to a rear surface of said disk.

4. The apparatus recited in claim 3 further comprising a pair of probe arms, each one supporting one of said pair of probes, wherein said probe arms are moveable to move said probes into and out of the circumference of said central aperture of said rotor.

5. The apparatus recited in claim 4 further comprising a support for supporting said housing, said rotor, and said probe arms.

6. The apparatus recited in claim 1 further including a disk transfer mechanism for vertically transferring said disk from a cassette to said rotor, wherein said transfer mechanism comprises an extractor for engaging a bottom edge portion of said disk and pushing said disk upward into substantial alignment with said central aperture of said rotor.

7. The apparatus recited in claim 6 wherein said transfer mechanism further comprises a guide for engaging a top edge portion of said disk and guiding said disk upward as said disk is pushed upward by said extractor.

8. The apparatus recited in claim 7 wherein said gripping mechanism is moveable out of the plane of said measurement position to engage said disk while said disk is engaged by said extractor.

9. Apparatus for handling and measuring a characteristic of a disk comprising:

a housing;

a rotor disposed in said housing and having a central aperture for receiving said disk, said rotor having at least one gripping mechanism for retaining said received disk in a substantially vertical orientation;

a motor for rotating said rotor relative to said housing;

a pair of probes for measuring a characteristic of said disk and providing a characteristic indicating signal, a first one of said probes being adjacent to a front surface of said received disk and a second one of said probes being adjacent to a rear surface of said received disk;

a plurality of wobble compensation probes coupled to said housing for measuring the distance to said rotor to determine a deviation of the plane of said rotor from a predetermined plane relative to said housing; and a signal processor receiving said characteristic indicating signal and said rotor plane deviation, wherein said characteristic indicating signal is modified in accordance with said rotor plane deviation in order to eliminate the effect of deviation of the plane of the rotor from the predetermined plane on the characteristic indicating signal.

10. Apparatus for handling a disk comprising:

a housing;

a rotor, disposed in said housing and spaced from said housing by a bearing, for receiving said disk;

a pressure source in communication with said bearing for introducing air into said bearing; and a vacuum source in communication with said bearing to draw said air away from said bearing.

11. Disk handling and measurement apparatus comprising:

a housing having a central aperture;

a retention mechanism adapted for retaining a disk having a front surface and a rear surface in substantial alignment with said central aperture so that substantially said entire front surface and substantially said entire rear surface of said disk are accessible; and a pair of measurement probes, a first one of said measurement probes being disposed adjacent to said front surface of said disk for measuring a characteristic of said disk and a second one of said measurement probes being disposed adjacent to said rear surface of said disk for measuring a characteristic of said disk.

12. Disk handling and measurement apparatus comprising:

a housing having a central aperture;

a retention mechanism adapted for retaining a disk having a front surface and a rear surface in substantial alignment with said central aperture so that said front surface and said rear surface of said disk are accessible; and a pair of measurement probes, a first one of said measurement probes adapted for making a measurement of said front surface of said disk and a second one of said measurement probes being adapted for making a measurement of said rear surface of said disk, wherein said pair of measurement probes is moveable to bring said first and second measurement probes into and out of the circumference of said disk.

13. Disk handling apparatus comprising:

a measurement station having a measurement position in which a received disk is disposed substantially vertically for measurement; and a retention mechanism adapted for retaining a disk in said measurement position so that the edge of said disk is contacted by said retention mechanism.

14. Disk handling apparatus comprising:

a measurement station having a measurement position in which a received disk is disposed for measurement;

a rotor rotatably coupled to said measurement station and having a retention mechanism adapted for retaining a disk in said measurement position; and a sensor for providing an image of said disk prior to retention of said disk by said retention mechanism.

15. Disk handling and measurement apparatus comprising:

a measurement station including a sensor for measuring a parameter of a disk; and a rotor subassembly coupled to said measurement station for receiving and rotating a disk, said rotor subassembly comprising:

(a) a housing fixedly coupled to said measurement station and having a housing central aperture;

(b) a rotor rotatably positioned in said housing central aperture and spaced from said housing by a bearing, said rotatable rotor having a retention mechanism adapted for retaining said received disk; and (c) a motor for rotating said rotor, said motor comprising a magnet coupled to said rotor and a stator coil coupled to said housing.

16. Disk transfer and retention apparatus comprising:

a measurement station having a measurement position in which a received disk is retained substantially vertically; and a transfer mechanism for transferring said disk from a first position, vertically to said measurement position, said transfer mechanism comprising an extractor for engaging a first portion of said disk and a guide for engaging a second portion of said disk as said disk is mowed vertically toward said measurement position.

17. Disk handling and measurement apparatus comprising:

a housing having a central aperture;

a rotor rotatably positioned in said housing central aperture and having a rotor central aperture;

a retention mechanism adapted for retaining a disk having a front surface and a rear surface in substantial alignment with said rotor central aperture so that said front surface and said rear surface of said disk are accessible; and a pair of probe arms, a first one of said probe arms adapted for being disposed adjacent to said front disk surface and a second one of said probe arms adapted for being disposed adjacent to said rear disk surface, wherein at least one of said pair of probe arms and said retention mechanism is moveable relative to the other one of said pair of probe arms and said retention mechanism to cause said first and second probe arms to traverse across the diameter of said retained disk as said disk is rotated by said rotor while a characteristic of said disk is measured.

18. Wafer handling and measurement apparatus comprising:

a measurement station for receiving a wafer in a measurement position for measurement of a characteristic of said wafer;

a rotor subassembly coupled to said measurement station and comprising:

a housing attached to said measurement station and having a housing central aperture;

a rotor rotatably positioned in said housing central aperture and having a rotor central aperture for receiving said wafer having a front surface and a rear surface so that said front surface and said rear surface of said wafer are accessible, said rotor having a retention mechanism for retaining said wafer in substantial alignment with said rotor central aperture;

a motor for rotating said rotor;

a pair of probe arms pivotally coupled to said measurement station, a first one of said probe arms adapted for positioning adjacent to said front surface of said wafer and a second one of said probe arms adapted for positioning adjacent to said rear surface of said wafer;

a transfer mechanism for transferring said wafer from a first position, vertically to said measurement position; and a sensor for providing an image of said wafer to determine the location of a flat on said wafer, wherein said rotor is rotated by said motor prior to retention of said wafer by said retention mechanism so that said retention mechanism avoids said flat.

19. Wafer measurement apparatus comprising:

at least one wafer measurement station having a measurement position in which a wafer is disposed for measurement;

a plurality of wafer sensors associated with said one or more stations, each of said wafer sensors providing measured output data indicative of a parameter of a wafer;

a plurality of artifact removal processors, each one corresponding to one of said plurality of wafer sensors and receiving said measured output data from said corresponding wafer sensor and artifact data, for model-based removal of data corruption associated with said output data to provide corrected wafer data; and a database coupled to said plurality of artifact removal processors and storing said corrected wafer data.

20. Wafer measurement apparatus comprising:

at least one wafer measurement station having a measurement position in which a wafer is disposed for measurement;

a plurality of wafer sensors associated with said one or more stations, each of said wafer sensors providing measured output data indicative of a different parameter of a wafer;

a database containing said output data from each of said plurality of wafer sensors; and an automated controller for activating a feature extraction processor in response to feature detection rules to retrieve and process said output data from said database provided by more than one of said plurality of wafer sensors in order to provide wafer information as a function of the combined wafer sensor measured output data.

21. Wafer handling and measurement apparatus comprising:

a plurality of wafer measurement stations, each having a measurement position in which a wafer is disposed vertically for measurement and at least one wafer sensor for providing measured output data indicative of a parameter of said wafer; and transport apparatus interconnecting said plurality of wafer measurement stations for conveying said wafer vertically and individually between said plurality of measurement stations.

22. Wafer handling and measurement apparatus comprising:

at least one wafer measurement station for receiving a wafer for measurement, said at least one wafer measurement station including at least one wafer sensor for providing wafer output data indicative of a parameter of said wafer;

a database containing said wafer output data from said at least one wafer sensor to provide a permanent wafer database containing wafer parameter information;

an automated wafer output data corrector for removing data error in the database output data; and a signal processor for retrieving said corrected database output data to provide wafer characteristic information in response said wafer parameter information.

23. A system for processing wafers comprising:

a plurality of wafer sensors, each one for measuring a parameter of a wafer and for providing wafer output data indicative of said measured wafer parameter;

a plurality of databases each containing said wafer output data from associated ones of said plurality of wafer sensors to provide a permanent wafer database of wafer data; and a network for interconnecting said plurality of databases through a corresponding plurality of information hubs to make data therein simultaneously accessible from a single network terminal.

24. A wafer processing system comprising:

a plurality of wafer sensors, each of said wafer sensors providing measured output data indicative of a parameter of a wafer;

a plurality of artifact removal processors, each one corresponding to one of said plurality of wafer sensors and receiving said measured output data from each of said wafer sensors and artifact data, for model-based removal of data corruption associated with said output data to provide corrected wafer data;

a plurality of databases each containing said wafer output data from associated ones of said plurality of artifact removal processors to provide a permanent database of corrected wafer data;

a controller for activating a feature extraction processor to retrieve and process said corrected wafer data from said database from more than one of said plurality of wafer sensors in order to provide wafer information as a function of the processed wafer data; and a network for interconnecting said plurality of databases through a corresponding plurality of information hubs.

25. Wafer processing apparatus comprising:

at least one wafer data generating device for receiving wafers at predetermined intervals during a wafer processing sequence and for generating output data indicative of a measured parameter of said received wafers at said predetermined intervals; and a display for displaying said output data, said display including wafer representing symbols indicative of at least one of the following:

(a) the degree of conformity of the measured parameter of one of said wafers to a predetermined specification;

(b) the degree of conformity of the measured parameter of a plurality of said wafers arranged by time to a predetermined specification;

(c) the degree of conformity of the measured parameter of at least one of said wafers to a predetermined specification on a predetermined day; and (d) the degree of conformity of the measured parameter of at least one of said wafers after a predetermined one of said intervals during said wafer processing sequence.

26. A wafer data network comprising:

a plurality of databases having data representative of sensed parameters of a plurality of wafers at different stages of manufacture and of operating conditions of plural wafer processing systems at different times processing different wafers; and a display system presenting on a display a plurality of wafer representing symbols, each representing different ones of wafer processing and wafer condition variables from said plurality of databases and each having a data representing characteristic representing combinations of at least one other of wafer processing and wafer condition variables, each symbol being expandable by operator selection to show by plural further symbols the at least one other variable decombined whereby each further symbol represents the further variable separately.

27. A wafer processing system comprising:

a plurality of wafer data generating devices;

a plurality of databases, each containing wafer data from associated ones of said plurality of wafer data generating devices to provide a permanent wafer database of corrected wafer data;

an information hub for interconnecting said plurality of databases;

a user terminal connected to said information hub for activating an access processor corresponding to a desired data correlation and decorrelation scheme for accessing wafer data from or more of said plurality of databases; and a display for displaying accessed wafer data, said display comprising a plurality of related levels, each level including a plurality of wafer representing symbols, each having a data representing characteristic, wherein said data is selected from the group consisting of: the day of wafer processing, the particular wafer processed, the location of wafer processing, and a measured wafer parameter, wherein said characteristic of each symbol indicates the degree of conformity of the corresponding data to a predetermined specification.

28. A semiconductor wafer factory process control and error correction system comprising:

a real time wafer processing system for processing wafers, said system comprising measurement apparatus for measuring wafer parameters and for providing output data indicative of said measured real time wafer parameters;

a simulated wafer processing system for providing output delta indicative of simulated measured wafer parameters; and a comparison processor for providing a difference signal indicative of the difference between said real time output data and said simulated output data, said difference signal being indicative of a deviation in the real time wafer processing system from a desired real time wafer processing system.

29. A semiconductor wafer factory process control and error correction system comprising:

a real time wafer processing system for processing wafers, said system comprising measurement apparatus for measuring wafer parameters and for providing output data indicative of said measured real time wafer parameters;

a simulated wafer processing system for providing output data indicative of simulated measured wafer parameters;

a comparison processor for providing a difference signal indicative of the difference between said real time output data and said simulated output data; and a feedback system for adjusting said real time wafer processing system in response to said difference signal.

30. A semiconductor wafer factory process control and error correction system comprising:

a real time wafer processing system for processing wafers, said system comprising measurement apparatus for measuring wafer parameters and for providing output data indicative of said measured real time wafer parameters;

a simulated wafer processing system for providing output data indicative of simulated measured wafer parameters, each one corresponding to one of said measured real time wafer parameters;

a plurality of comparison processors, each one comparing one of said measured real time wafer parameters with the corresponding one of said simulated measured wafer parameters and for providing a difference signal indicative of the difference therebetween;

a database containing corrective steps for overcoming deviations during said real time wafer processing; and a controller coupled to said database and receiving said difference signal, for activating one of said corrective steps contained in said database in response to said difference signal.

31. Apparatus for handling a disk comprising:

a housing;

a rotor for receiving a disk, said rotor having at least one gripping mechanism moveable between a first position for retaining said received disk in a measurement position and a second position for releasing said received disk;

a pressure source in communication with said at least one gripping mechanism to move said gripping mechanism into engagement with said retained disk; and a vacuum source in communication with said at least one gripping mechanism to move said gripping mechanism to release said retained disk.

* * * * *